US007114964B2

(12) United States Patent
Winings et al.

(10) Patent No.: US 7,114,964 B2
(45) Date of Patent: Oct. 3, 2006

(54) CROSS TALK REDUCTION AND IMPEDANCE MATCHING FOR HIGH SPEED ELECTRICAL CONNECTORS

(75) Inventors: Clifford L. Winings, Etters, PA (US); Joseph B. Shuey, Camp Hill, PA (US); Timothy A. Lemke, Dillsburg, PA (US); Gregory A. Hull, York, PA (US); Stephen B. Smith, Mechanicsburg, PA (US); Stefaan Hendrik Josef Sercu, Velddriel (NL); Timothy W. Houtz, Etters, PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 11/052,167

(22) Filed: Feb. 7, 2005

(65) Prior Publication Data

US 2005/0287849 A1 Dec. 29, 2005

Related U.S. Application Data

(63) Continuation of application No. 10/294,966, filed on Nov. 14, 2002, now Pat. No. 6,976,886, which is a continuation-in-part of application No. 10/155,786, filed on May 24, 2002, now Pat. No. 6,652,318, which is a continuation-in-part of application No. 09/990,794, filed on Nov. 14, 2001, now Pat. No. 6,692,272.

(51) Int. Cl.
*H05K 1/00* (2006.01)

(52) U.S. Cl. ......................... 439/79; 439/701; 439/608

(58) Field of Classification Search ................ 439/701, 439/108, 608, 79
See application file for complete search history.

(56) References Cited

U.S. PATENT DOCUMENTS 3,286,220 A 11/1966 Marley et al. .............. 339/192
3,538,486 A 11/1970 Shlesinger, Jr. .............. 339/74
3,669,054 A 6/1972 Desso et al. ................ 113/119
3,748,633 A 7/1973 Lundergan .............. 339/217 S
4,076,362 A 2/1978 Ichimura ..................... 339/75
4,159,861 A 7/1979 Anhalt ......................... 339/75
4,260,212 A 4/1981 Ritchie et al. ............ 339/97 R (Continued)

FOREIGN PATENT DOCUMENTS

EP 0 273 683 B1 3/1993

(Continued)

OTHER PUBLICATIONS

Nadolny, J. et al., "Optimizing Connector Selection for Gigabit Signal Speeds", *ECN*™, Sep. 1, 2000, http://www.ecnmag.com/article/CA45245, 6 pages.

(Continued)

*Primary Examiner*—Ross Gushi
(74) *Attorney, Agent, or Firm*—Woodcock Washburn LLP

(57) ABSTRACT

Lightweight, low-cost, high-density electrical connectors are disclosed that provide impedance-controlled, high-speed, low-interference communications, even in the absence of shields between the contacts, and that provide for a variety of other benefits not found in prior art connectors. An example of such an electrical connector may include a first signal contact positioned within a first linear array of electrical contacts and a second signal contact positioned within a second linear array of electrical contacts that is adjacent to the first linear array. Either of the signal contacts may be a single-ended signal conductor, or one of a differential signal pair. The connector may be devoid of shields between the signal contacts, and of ground contacts adjacent to the signal contacts.

56 Claims, 38 Drawing Sheets

U.S. PATENT DOCUMENTS

| | | | | |
|---|---|---|---|---|
| 4,288,139 | A | 9/1981 | Cobaugh et al. | 339/74 R |
| 4,383,724 | A | 5/1983 | Verhoeven | 339/19 |
| 4,402,563 | A | 9/1983 | Sinclair | 339/75 |
| 4,560,222 | A | 12/1985 | Dambach | 339/75 |
| 4,717,360 | A | 1/1988 | Czaja | 439/710 |
| 4,776,803 | A | 10/1988 | Pretchel et al. | 439/59 |
| 4,815,987 | A | 3/1989 | Kawano et al. | 439/263 |
| 4,867,713 | A | 9/1989 | Ozu et al. | 439/833 |
| 4,907,990 | A | 3/1990 | Bertho et al. | 439/851 |
| 4,913,664 | A | 4/1990 | Dixon et al. | 439/607 |
| 4,973,271 | A | 11/1990 | Ishizuka et al. | 439/839 |
| 5,066,236 | A | 11/1991 | Broeksteeg | 439/79 |
| 5,077,893 | A | 1/1992 | Mosquera et al. | 29/882 |
| 5,174,770 | A | 12/1992 | Sasaki et al. | 439/108 |
| 5,238,414 | A | 8/1993 | Yaegashi et al. | 439/108 |
| 5,254,012 | A | 10/1993 | Wang | 439/263 |
| 5,274,918 | A | 1/1994 | Reed | 29/882 |
| 5,277,624 | A | 1/1994 | Champion et al. | 439/607 |
| 5,286,212 | A | 2/1994 | Broeksteeg | 439/108 |
| 5,302,135 | A | 4/1994 | Lee | 439/263 |
| 5,342,211 | A | 8/1994 | Broeksteeg | 439/108 |
| 5,356,300 | A | 10/1994 | Costello et al. | 439/101 |
| 5,356,301 | A | 10/1994 | Champion et al. | 439/108 |
| 5,357,050 | A | 10/1994 | Baran et al. | 174/33 |
| 5,431,578 | A | 7/1995 | Wayne | 439/259 |
| 5,475,922 | A | 12/1995 | Tamura et al. | 29/881 |
| 5,558,542 | A | 9/1996 | O'Sullivan et al. | 439/682 |
| 5,586,914 | A | 12/1996 | Foster, Jr. et al. | 439/676 |
| 5,590,463 | A | 1/1997 | Feldman et al. | 29/844 |
| 5,609,502 | A | 3/1997 | Thumma | 439/747 |
| 5,713,746 | A | 2/1998 | Olson et al. | 439/79 |
| 5,730,609 | A | 3/1998 | Harwath | 439/108 |
| 5,741,144 | A | 4/1998 | Elco et al. | 439/101 |
| 5,741,161 | A | 4/1998 | Cahaly et al. | 439/709 |
| 5,795,191 | A | 8/1998 | Preputnick et al. | 439/608 |
| 5,817,973 | A | 10/1998 | Elco | 174/32 |
| 5,853,797 | A | 12/1998 | Fuchs et al. | 427/96 |
| 5,908,333 | A | 6/1999 | Perino et al. | 439/631 |
| 5,961,355 | A | 10/1999 | Morlion et al. | 439/686 |
| 5,967,844 | A | 10/1999 | Doutrich et al. | 439/607 |
| 5,971,817 | A | 10/1999 | Longueville | 439/857 |
| 5,980,321 | A | 11/1999 | Cohen et al. | 439/608 |
| 5,993,259 | A | 11/1999 | Stokoe et al. | 439/608 |
| 6,050,862 | A | 4/2000 | Ishii | 439/843 |
| 6,068,520 | A | 5/2000 | Winings et al. | 439/676 |
| 6,116,926 | A | 9/2000 | Ortega et al. | 439/108 |
| 6,123,554 | A | 9/2000 | Ortega et al. | 439/79 |
| 6,125,535 | A | 10/2000 | Chiou et al. | 29/883 |
| 6,129,592 | A | 10/2000 | Mickievicz et al. | 439/701 |
| 6,139,336 | A | 10/2000 | Olson | 439/83 |
| 6,146,157 | A | 11/2000 | Lenoir et al. | 439/101 |
| 6,146,203 | A | 11/2000 | Elco et al. | 439/609 |
| 6,190,213 | B1 | 2/2001 | Reichart et al. | 439/736 |
| 6,212,755 | B1 | 4/2001 | Shimada et al. | 29/527.1 |
| 6,219,913 | B1 | 4/2001 | Uchiyama | 29/883 |
| 6,220,896 | B1 | 4/2001 | Bertoncici et al. | 439/608 |
| 6,227,882 | B1 | 5/2001 | Ortega et al. | 439/101 |
| 6,269,539 | B1 | 8/2001 | Takahashi et al. | 29/883 |
| 6,293,827 | B1 | 9/2001 | Stokoe et al. | 439/608 |
| 6,319,075 | B1 | 11/2001 | Clark et al. | 439/825 |
| 6,322,379 | B1 | 11/2001 | Ortega et al. | 439/108 |
| 6,322,393 | B1 | 11/2001 | Doutrich et al. | 439/607 |
| 6,328,602 | B1 | 12/2001 | Yamasaki et al. | 439/608 |
| 6,343,955 | B1 | 2/2002 | Billman et al. | 439/608 |
| 6,347,952 | B1 | 2/2002 | Hasegawa et al. | 439/608 |
| 6,350,134 | B1 * | 2/2002 | Fogg et al. | 439/79 |
| 6,354,877 | B1 | 3/2002 | Shuey et al. | 439/608 |
| 6,358,061 | B1 | 3/2002 | Regnier | 439/60 |
| 6,361,366 | B1 | 3/2002 | Shuey et al. | 439/608 |
| 6,363,607 | B1 | 4/2002 | Chen et al. | 29/883 |
| 6,364,710 | B1 | 4/2002 | Billman et al. | 439/608 |
| 6,371,773 | B1 | 4/2002 | Crofoot et al. | 439/79 |
| 6,379,188 | B1 | 4/2002 | Cohen et al. | 439/608 |
| 6,386,914 | B1 | 5/2002 | Collins et al. | 439/579 |
| 6,409,543 | B1 | 6/2002 | Astbury et al. | 439/608 |
| 6,431,914 | B1 | 8/2002 | Billman | 439/608 |
| 6,435,914 | B1 | 8/2002 | Billman | 439/608 |
| 6,461,202 | B1 | 10/2002 | Kline | 439/701 |
| 6,471,548 | B1 | 10/2002 | Bertoncini et al. | 439/608 |
| 6,482,038 | B1 | 11/2002 | Olson | 439/608 |
| 6,485,330 | B1 | 11/2002 | Doutrich | 439/572 |
| 6,494,734 | B1 | 12/2002 | Shuey | 439/378 |
| 6,506,081 | B1 | 1/2003 | Blanchfield et al. | 439/682 |
| 6,520,803 | B1 | 2/2003 | Dunn | 439/608 |
| 6,527,587 | B1 | 3/2003 | Ortega et al. | 439/608 |
| 6,537,111 | B1 | 3/2003 | Brammer et al. | 439/857 |
| 6,540,559 | B1 * | 4/2003 | Kemmick et al. | 439/608 |
| 6,554,647 | B1 | 4/2003 | Cohen et al. | 439/607 |
| 6,572,410 | B1 | 6/2003 | Volstorf et al. | 439/608 |
| 6,652,318 | B1 | 11/2003 | Winings et al. | 439/608 |
| 6,692,272 | B1 | 2/2004 | Lemke et al. | 439/108 |
| 6,695,627 | B1 | 2/2004 | Ortega et al. | 439/78 |
| 6,776,649 | B1 | 8/2004 | Pape et al. | 439/485 |
| 6,843,686 | B1 | 1/2005 | Ohnishi et al. | 439/608 |
| 6,851,974 | B1 | 2/2005 | Doutrich | 439/572 |
| 6,869,292 | B1 | 3/2005 | Johnescu et al. | 439/74 |
| 6,913,490 | B1 | 7/2005 | Whiteman, Jr. et al. | 439/608 |
| 6,981,883 | B1 | 1/2006 | Raistrick et al. | 439/74 |
| 2002/0143894 | A1 | 10/2002 | Takayama | 709/217 |
| 2003/0220021 | A1 | 11/2003 | Whiteman, Jr. et al. | 439/608 |

FOREIGN PATENT DOCUMENTS

| | | | |
|---|---|---|---|
| EP | 1 148 587 | B1 | 4/2005 |
| JP | 06-236778 | | 8/1994 |
| JP | 07-114958 | | 5/1995 |
| JP | 2000-003743 | | 1/2000 |
| JP | 2000-003744 | | 1/2000 |
| JP | 2000-003745 | | 1/2000 |
| JP | 2000-003746 | | 1/2000 |
| WO | WO 01/29931 | A1 | 4/2001 |
| WO | WO 01/39332 | A1 | 5/2001 |

OTHER PUBLICATIONS

"PCB-Mounted Receptacle Assemblies, 2.00 mm(0.079in) Centerlines, Right-Angle Solder-to-Board Signal Receptacle", *Metral*™, Berg Electronics, 10-6-10-7.

Metral™ "Speed and Density Extensions", FCI, Jun. 3, 1999, 25 pages.

Framatome Connector Specification, 1 page.

MILLIPACS Connector Type A Specification, 1 page.

Fusi, M.A. et al., "Differential Signal Transmission through Backplanes and Connectors", *Electronic Packaging and Production*, Mar. 1996, 27-31.

Goel, R.P. et al., "AMP Z-Pack Interconnect System", 1990, AMP Incorporated, 9 pages.

"FCI's Airmax VS® Connector System Honored at DesignCon", 2005, Heilind Electronics, Inc., http://www.heilind.com/products/fci/airmax-vs-design.asp, 1 page.

Hult, B., "FCI's Problem Solving Approach Changes Market, The FCI Electronics AirMax VS®", ConnectorSupplier.com, Http://www.connectorsupplier.com/tech_updates_FCI-Airmax_archive.htm, 2006, 4 pages.

Backplane Products Overview Page, http://www.molex.com/cgi-bin/bv/molex/super_family.jsp?BV_Session ID=@, 2005-2006© Molex, 4 pages.

AMP Z-Pack 2mm HM Interconnection System, 1992 and 1994© by AMP Incorporated, 6 pages.

Metral® 2mm High-Speed Connectors, 1000, 2000, 3000 Series, Electrical Performance Data for Differential Applications, FCI Framatome Group, 2 pages.

HDM® HDM Plus® Connectors, http://www.teradyne.com/prods/tcs/products/connectors/backplane/hdm/index.html, 2006, 1 page.

Amphenol TCS (ATCS):HDM® Stacker Signal Integrity, http://www.teradyne.com/prods/tcs/products/connectors/mezzanine/hdm_stacker/signintegr, 3 pages.
Amphenol TCS (ATCS):VHDM Connector, http://www.teradyne.com/prods/tcs/products/connectors/backplane/vhdm/index.html, 2 pages.
VHDM High-Speed Differential (VHDM HSD), http://www.teradyne.com/prods/bps/vhdm/hsd.html, 6 pages.
Amphenol TCS(ATCS): VHDM L-Series Connector, http://www.teradyne.com/prods/tcs/products/connectors/backplane/vhdm_1-series/index.html, 2006, 4 pages.
VHDM Daughterboard Connectors Feature press-fit Terminations and a Non-Stubbing Seperable Interface, ©Teradyne, Inc. Connections Systems Division, Oct. 8, 1997, 46 pages.
HDM/HDM *plus*, 2mm Backplane Interconnection System, Teradyne Connection Systems, ©1993, 22 pages.
HDM Separable Interface Detail, Molex®, 3 pages.
"Lucent Technologies ' Bell Labs and FCI Demonstrate 25gb/S Data Transmission over Electrical Backplane Connectors", Feb. 1, 2005, http://www.lucent.com/press/0205/050201.bla.html, 4 pages.
"B.? Bandwidth and Rise Time Budgets", Module 1-8. Fiber Optic Telecommunications (E-XVI-2a), http://cord.org/step_online/st1-8/st18exvi2a.htm, 3 pages.
"Tyco Electronics, 2-Dok and Connector", Tyco Electronics, Jun. 23, 2003, http://2dok.tyco.elcetronics.com, 15 pages.
Tyco Electronics/AMP, "2-Dok and 2-Dok and Connectors", Application Specification # 114-13068, Aug. 30, 2005, Revision A, 16 pages.
Tyco Electronics, "Champ 2-Dok Connector System", Catalog # 1309281, Issued Jan. 2002, 3 pages.

* cited by examiner

Section A-A

Section B-B

CROSS TALK REDUCTION AND IMPEDANCE MATCHING FOR HIGH SPEED ELECTRICAL CONNECTORS

CROSS-REFERENCE TO RELATED APPLICATIONS

This application is a continuation of U.S. patent application Ser. No. 10/294,966, filed Nov. 14, 2002, now U.S. Pat. No. 6,976,886 which is a continuation-in-part of U.S. patent application Ser. No. 09/990,794, filed Nov. 14, 2001, now U.S. Pat. No. 6,692,272, and of U.S. patent application Ser. No. 10/155,786, filed May 24, 2002, now U.S. Pat. No. 6,652,318. The contents of each of the above-referenced patents and patent applications is incorporated herein by reference.

FIELD OF THE INVENTION

Generally, the invention relates to the field of electrical connectors. More particularly, the invention relates to lightweight, low cost, high density electrical connectors that provide impedance controlled, high-speed, low interference communications, even in the absence of shields between the contacts, and that provide for a variety of other benefits not found in prior art connectors.

BACKGROUND OF THE INVENTION

Electrical connectors provide signal connections between electronic devices using signal contacts. Often, the signal contacts are so closely spaced that undesirable interference, or "cross talk," occurs between adjacent signal contacts. As used herein, the term "adjacent" refers to contacts (or rows or columns) that are next to one another. Cross talk occurs when one signal contact induces electrical interference in an adjacent signal contact due to intermingling electrical fields, thereby compromising signal integrity. With electronic device miniaturization and high speed, high signal integrity electronic communications becoming more prevalent, the reduction of cross talk becomes a significant factor in connector design.

One commonly used technique for reducing cross talk is to position separate electrical shields, in the form of metallic plates, for example, between adjacent signal contacts. The shields act to block cross talk between the signal contacts by blocking the intermingling of the contacts' electric fields. FIGS. 1A and 1B depict exemplary contact arrangements for electrical connectors that use shields to block cross talk.

FIG. 1A depicts an arrangement in which signal contacts S and ground contacts G are arranged such that differential signal pairs S+, S− are positioned along columns 101–106. As shown, shields 112 can be positioned between contact columns 101–106. A column 101–106 can include any combination of signal contacts S+, S− and ground contacts G. The ground contacts G serve to block cross talk between differential signal pairs in the same column. The shields 112 serve to block cross talk between differential signal pairs in adjacent columns.

FIG. 1B depicts an arrangement in which signal contacts S and ground contacts G are arranged such that differential signal pairs S+, S− are positioned along rows 111–116. As shown, shields 122 can be positioned between rows 111–116. A row 111–116 can include any combination of signal contacts S+, S− and ground contacts G. The ground contacts G serve to block cross talk between differential signal pairs in the same row. The shields 122 serve to block cross talk between differential signal pairs in adjacent rows.

Because of the demand for smaller, lower weight communications equipment, it is desirable that connectors be made smaller and lower in weight, while providing the same performance characteristics. Shields take up valuable space within the connector that could otherwise be used to provide additional signal contacts, and thus limit contact density (and, therefore, connector size). Additionally, manufacturing and inserting such shields substantially increase the overall costs associated with manufacturing such connectors. In some applications, shields are known to make up 40% or more of the cost of the connector. Another known disadvantage of shields is that they lower impedance. Thus, to make the impedance high enough in a high contact density connector, the contacts would need to be so small that they would not be robust enough for many applications.

The dielectrics that are typically used to insulate the contacts and retain them in position within the connector also add undesirable cost and weight.

Therefore, a need exists for a lightweight, high-speed electrical connector (i.e., one that operates above 1 Gb/s and typically in the range of about 10 Gb/s) that reduces the occurrence of cross talk without the need for separate shields, and provides for a variety of other benefits not found in prior art connectors.

BRIEF SUMMARY OF THE INVENTION

An electrical connector according to the invention may include a first signal contact positioned within a first linear array of electrical contacts and a second signal contact positioned within a second linear array of electrical contacts that is adjacent to the first linear array. Either of the signal contacts may be a single-ended signal conductor, or one of a differential signal pair. The connector may be devoid of shields between the signal contacts. The connector may be devoid of shields between the first linear array and the second linear array. The connector may be devoid of ground contacts adjacent to the signal contacts.

The connector may include a third signal contact or a ground contact disposed within the first linear array adjacent to the first signal contact. The first and third signal contacts may have a gap between them of between about 0.3 mm and 0.4 mm, and may be edge-coupled to one another. Such a connector may comprise a first column of electrical contacts comprising a first arrangement of differential signal pairs separated from one another by first ground contacts, a second column of electrical contacts comprising a second arrangement of differential signal pairs separated from one another by second ground contacts, wherein one differential signal pair in the second arrangement of differential signal pairs is a victim differential signal pair, and a third column of electrical contacts comprising a third arrangement of differential signal pairs separated from one another by third ground contacts. The second column may be adjacent to the first column, and the third column adjacent to the second column. The connector may be devoid of electrical shields between the first column and the second column, and between the second column and the third column. The contacts in the first column may be spaced apart from the contacts in the second column by a column-spacing distance of about 1.8–2.0 millimeters, and the contacts in the second column may be spaced apart from the contacts in the third column by the same column-spacing distance. Each of the differential signal pairs may define a gap distance between the electrical contacts that form the pair. The gap distance relative to the column-spacing distance may be such that differential signals with rise times of 200 picoseconds in the six differential signal pairs in the first, second, and third columns that are closest to the victim pair produce no more than 6% worst-case, multi-active cross talk on the victim differential signal pair.

The connector may be a high-speed connector, i.e., a connector that operates at signal speeds in a range of about one gigabit/sec to about ten gigabits/sec. Such a high-speed connector may comprise a first column of electrical contacts comprising a first arrangement of differential signal pairs each separated from one another by first ground contacts a second column of electrical contacts comprising a second arrangement of differential signal pairs each separated from one another by second ground contacts, wherein one differential signal pair in the second arrangement of differential signal pairs is a victim pair and a third column of electrical contacts comprising a third arrangement of differential signal pairs each separated from one another by third ground contacts. The second column may be adjacent to the first column, and the third column may be adjacent to the second column. The connector may be devoid of electrical shields between the first column and the second column, and between the second column and the third column. The first column, the second column, and the third column may be evenly spaced apart from one another by an equal column-spacing distance of about 1.8 to 2 millimeters. Each of the differential signal pairs may define a gap distance between electrical contacts that form each differential signal pair. The gap distance relative to the column-spacing distance may be such that differential signals with rise times of 40 picoseconds in the six differential signal pairs in the first, second, and third columns that are closest to the victim pair produce no more than an acceptable level of worst-case, multi-active cross talk on the victim pair.

BRIEF DESCRIPTION OF THE DRAWINGS

The invention is further described in the detailed description that follows, by reference to the noted drawings by way of non-limiting illustrative embodiments of the invention, in which like reference numerals represent similar parts throughout the drawings, and wherein.

DETAILED DESCRIPTION OF THE INVENTION

Certain terminology may be used in the following description for convenience only and should not be considered as limiting the invention in any way. For example, the terms "top," "bottom," "left," "right," "upper," and "lower"

designate directions in the figures to which reference is made. Likewise, the terms “inwardly” and “outwardly” designate directions toward and away from, respectively, the geometric center of the referenced object. The terminology includes the words above specifically mentioned, derivatives thereof, and words of similar import.

I-Shaped Geometry for Electrical Connectors—Theoretical Model

Figure 1A:
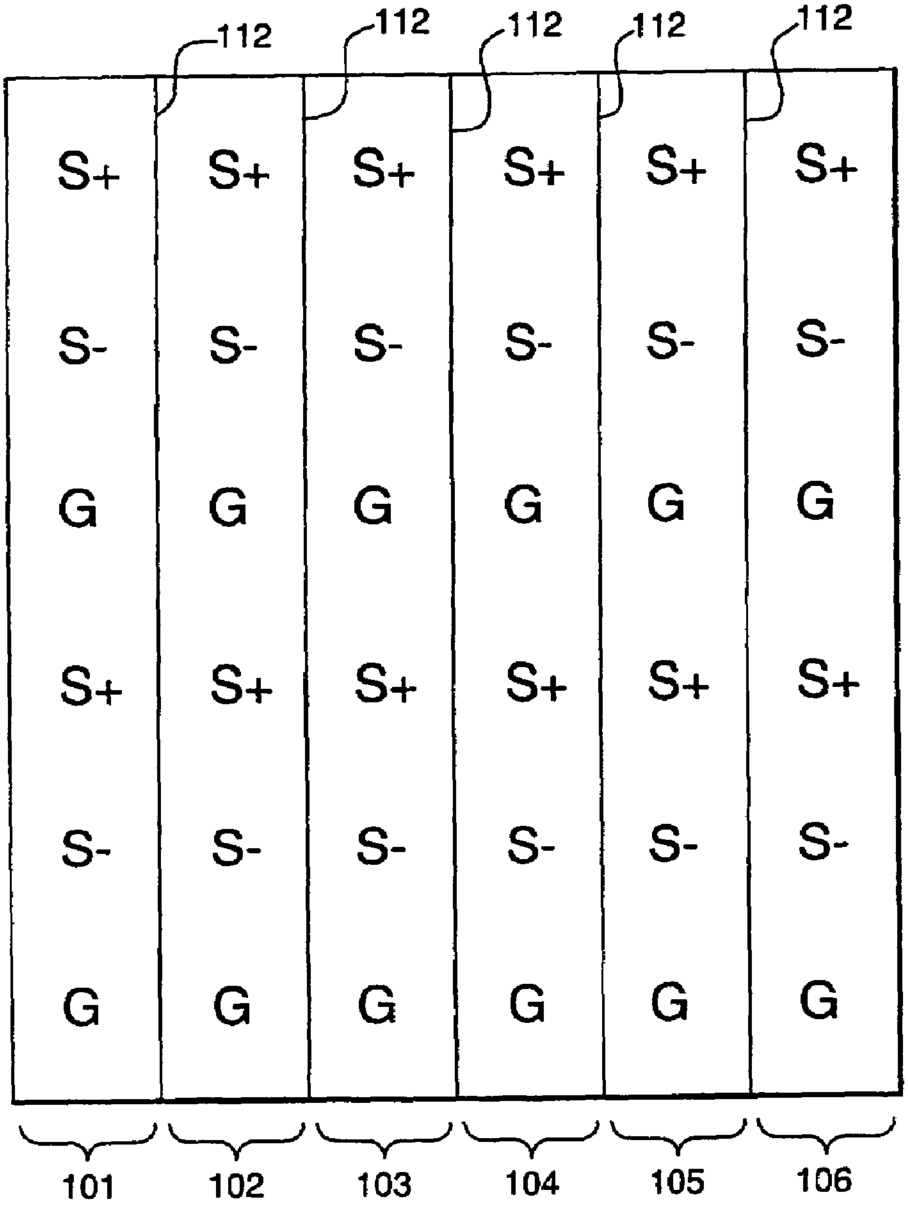
FIG. 1A (PRIOR ART)
FIGS. 1A and 1B depict exemplary contact arrangements for electrical connectors that use shields to block cross talk.
Figure 1B:
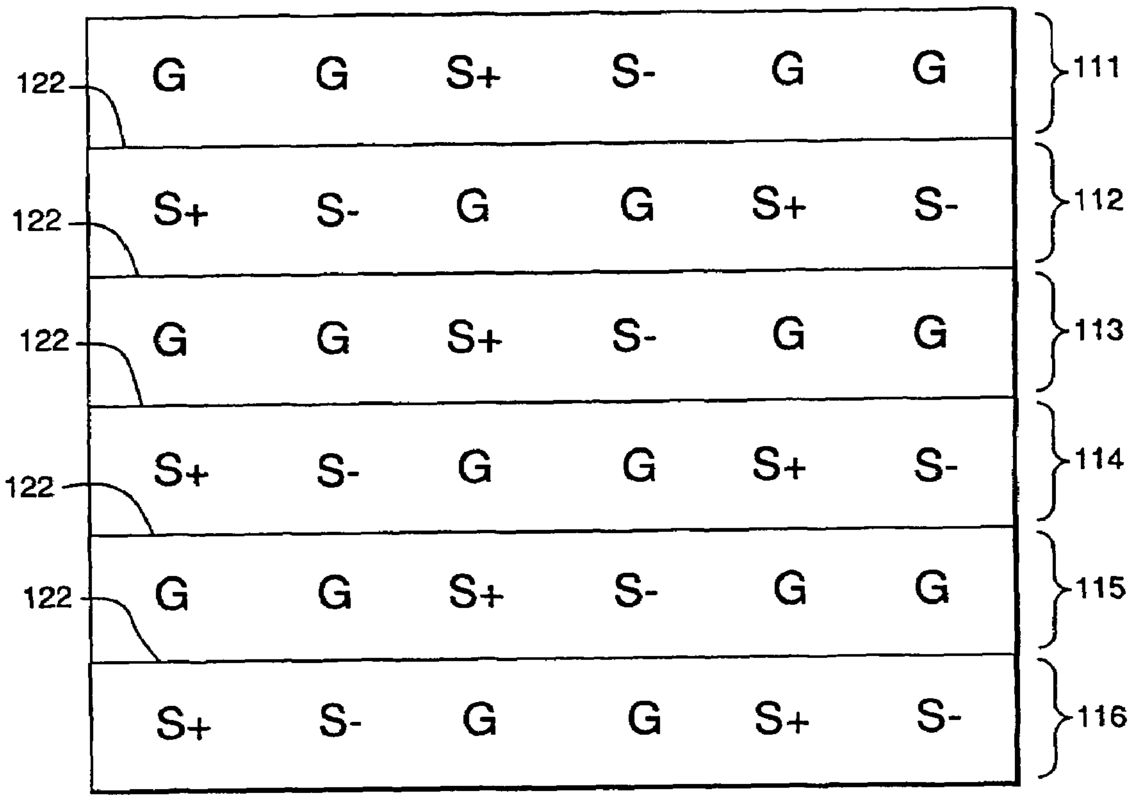
FIG. 1B (PRIOR ART)
Figure 2A:
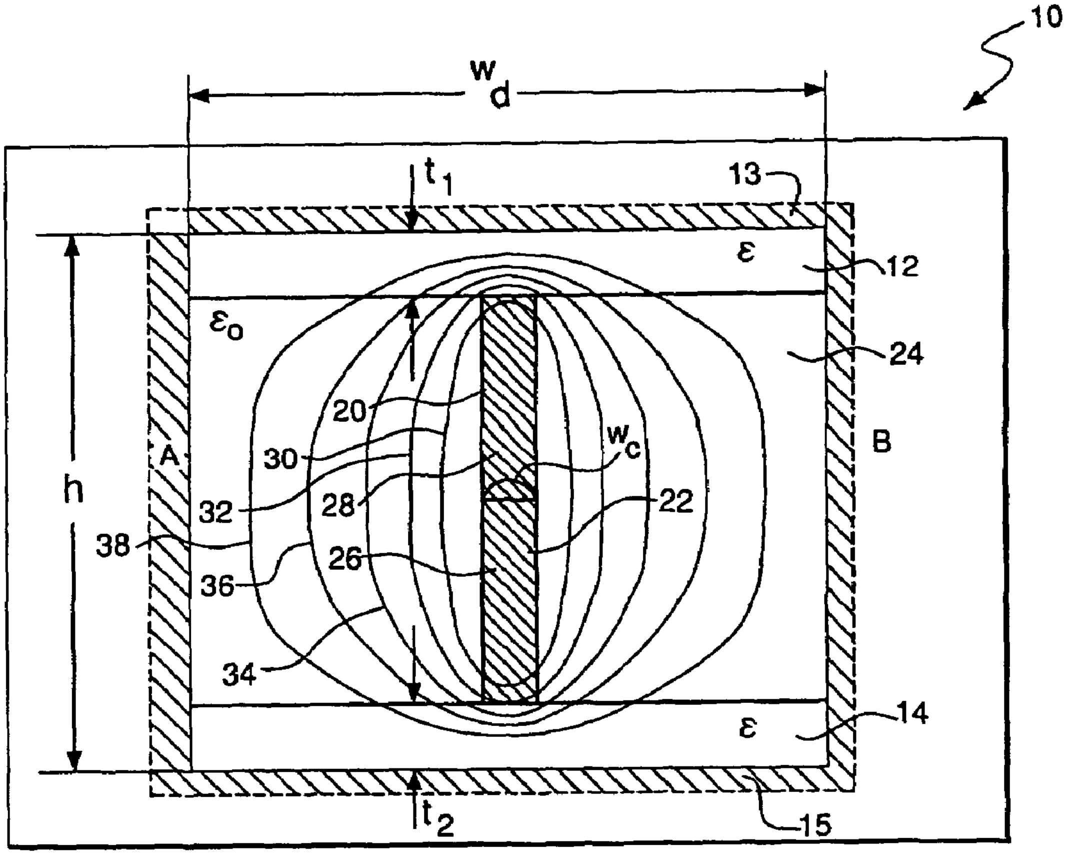
FIG. 2A (PRIOR ART)
FIG. 2A is a schematic illustration of an electrical connector in which conductive and dielectric elements are arranged in a generally "I" shaped geometry.

FIG. 2A is a schematic illustration of an electrical connector in which conductive and dielectric elements are arranged in a generally “I” shaped geometry. Such connectors are embodied in the assignee’s “I-BEAM” technology, and are described and claimed in U.S. Pat. No. 5,741,144, entitled “Low Cross And Impedance Controlled Electric Connector,” the disclosure of which is hereby incorporated herein by reference in its entirety. Low cross talk and controlled impedance have been found to result from the use of this geometry.

The originally contemplated I-shaped transmission line geometry is shown in FIG. 2A. As shown, the conductive element can be perpendicularly interposed between two parallel dielectric and ground plane elements. The description of this transmission line geometry as I-shaped comes from the vertical arrangement of the signal conductor shown generally at numeral 10 between the two horizontal dielectric layers 12 and 14 having a dielectric constant $\epsilon$ and ground planes 13 and 15 symmetrically placed at the top and bottom edges of the conductor. The sides 20 and 22 of the conductor are open to the air 24 having an air dielectric constant $\epsilon_0$. In a connector application, the conductor could include two sections, 26 and 28, that abut end-to-end or face-to-face. The thickness, $t_1$ and $t_2$ of the dielectric layers 12 and 14, to first order, controls the characteristic impedance of the transmission line and the ratio of the overall height h to dielectric width $w_d$ controls the electric and magnetic field penetration to an adjacent contact. Original experimentation led to the conclusion that the ratio $h/w_d$ needed to minimize interference beyond A and B would be approximately unity (as illustrated in FIG. 2A).

The lines 30, 32, 34, 36 and 38 in FIG. 2A are equipotentials of voltage in the air-dielectric space. Taking an equipotential line close to one of the ground planes and following it out towards the boundaries A and B, it will be seen that both boundary A or boundary B are very close to the ground potential. This means that virtual ground surfaces exist at each of boundary A and boundary B. Therefore, if two or more I-shaped modules are placed side-by-side, a virtual ground surface exists between the modules and there will be little to no intermingling of the modules’ fields. In general, the conductor width $w_c$ and dielectric thicknesses $t_1$, $t_2$ should be small compared to the dielectric width $w_d$ or module pitch (i.e., distance between adjacent modules).

Given the mechanical constraints on a practical connector design, it was found in actuality that the proportioning of the signal conductor (blade/beam contact) width and dielectric thicknesses could deviate somewhat from the preferred ratios and some minimal interference might exist between adjacent signal conductors. However, designs using the above-described I-shaped geometry tend to have lower cross talk than other conventional designs.

Exemplary Factors Affecting Cross Talk Between Adjacent Contacts

Figure 2B:
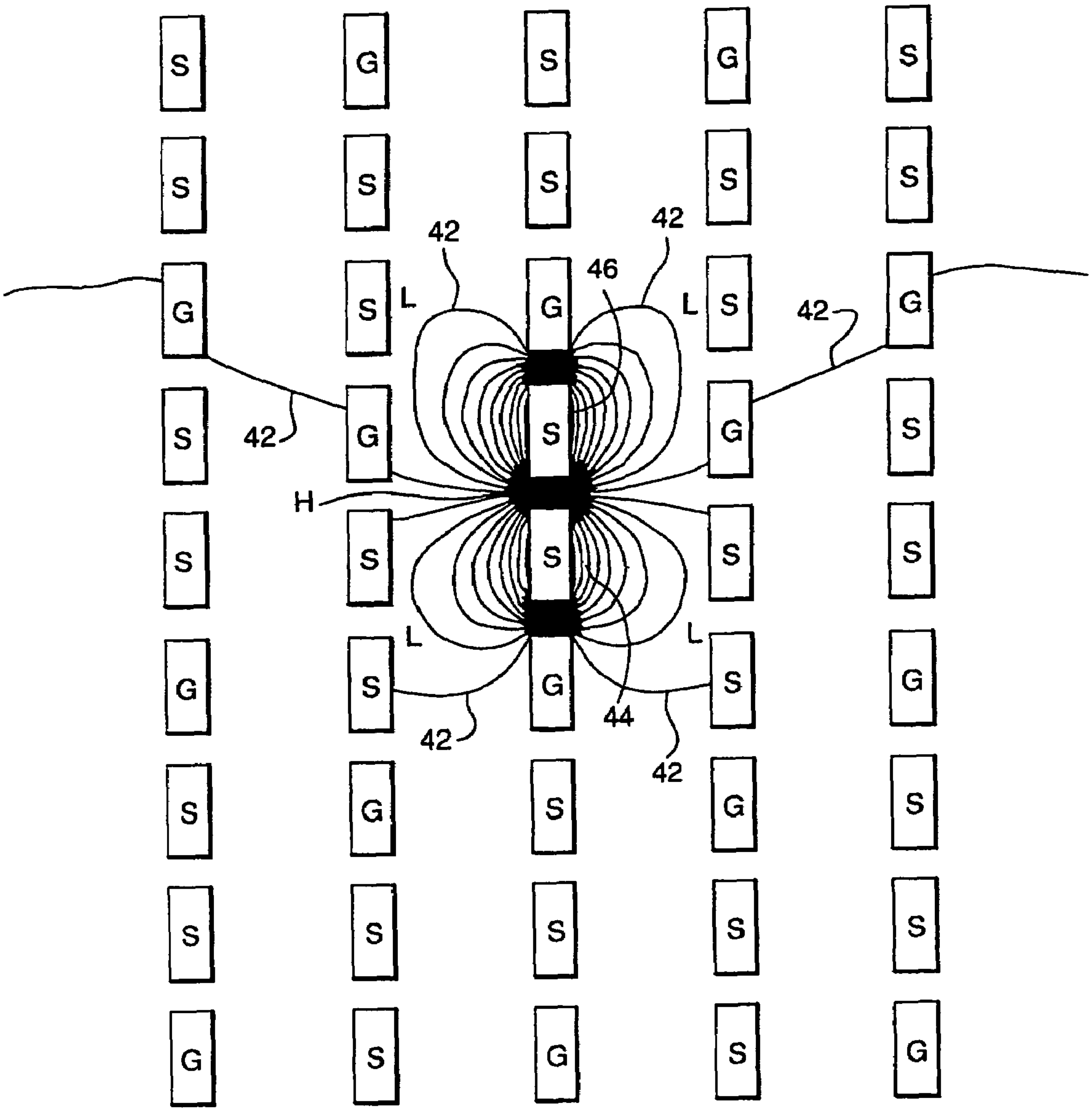
FIG. 2B depicts equipotential regions within an arrangement of signal and ground contacts.

In accordance with the invention, the basic principles described above were further analyzed and expanded upon and can be employed to determine how to even further limit cross talk between adjacent signal contacts, even in the absence of shields between the contacts, by determining an appropriate arrangement and geometry of the signal and ground contacts. FIG. 2B includes a contour plot of voltage in the neighborhood of an active column-based differential signal pair S+, S− in a contact arrangement of signal contacts S and ground contacts G according to the invention. As shown, contour lines 42 are closest to zero volts, contour lines 44 are closest to −1 volt, and contour lines 46 are closest to +1 volt. It has been observed that, although the voltage does not necessarily go to zero at the “quiet” differential signal pairs that are nearest to the active pair, the interference with the quiet pairs is near zero. That is, the voltage impinging on the positive-going quiet differential pair signal contact is about the same as the voltage impinging on the negative-going quiet differential pair signal contact. Consequently, the noise on the quiet pair, which is the difference in voltage between the positive- and negative-going signals, is close to zero.

Thus, as shown in FIG. 2B, the signal contacts S and ground contacts G can be scaled and positioned relative to one another such that a differential signal in a first differential signal pair produces a high field H in the gap between the contacts that form the signal pair and a low (i.e., close to ground potential) field L (close to ground potential) near an adjacent signal pair. Consequently, cross talk between adjacent signal contacts can be limited to acceptable levels for the particular application. In such connectors, the level of cross talk between adjacent signal contacts can be limited to the point that the need for (and cost of) shields between adjacent contacts is unnecessary, even in high speed, high signal integrity applications.

Through further analysis of the above-described I-shaped model, it has been found that the unity ratio of height to width is not as critical as it first seemed. It has also been found that a number of factors can affect the level of cross talk between adjacent signal contacts. A number of such factors are described in detail below, though it is anticipated that there may be others. Additionally, though it is preferred that all of these factors be considered, it should be understood that each factor may, alone, sufficiently limit cross talk for a particular application. Any or all of the following factors may be considered in determining a suitable contact arrangement for a particular connector design:

a) Less cross talk has been found to occur where adjacent contacts are edge-coupled (i.e., where the edge of one contact is adjacent to the edge of an adjacent contact) than where adjacent contacts are broad side coupled (i.e., where the broad side of one contact is adjacent to the broad side of an adjacent contact) or where the edge of one contact is adjacent to the broad side of an adjacent contact. The tighter the edge coupling, the less the coupled signal pair’s electrical field will extend towards an adjacent pair and the less the towards the unity height-to-width ratio of the original I-shaped theoretical model a connector application will have to approach. Edge coupling also allows for smaller gap widths between adjacent connectors, and thus facilitates the achievement of desirable impedance levels in high contact density connectors without the need for contacts that are too small to perform adequately. For example, it has been found than a gap of about 0.3–0.4 mm is adequate to provide an impedance of about 100 ohms where the contacts are edge coupled, while a gap of about 1 mm is necessary where the same contacts are broad side coupled to achieve the same impedance. Edge coupling also facilitates changing contact width, and therefore gap width, as the contact extends through dielectric regions, contact regions, etc.;

b) It has also been found that cross talk can be effectively reduced by varying the "aspect ratio," i.e., the ratio of column pitch (i.e., the distance between adjacent columns) to the gap between adjacent contacts in a given column;

c) The "staggering" of adjacent columns relative to one another can also reduce the level of cross talk. That is, cross talk can be effectively limited where the signal contacts in a first column are offset relative to adjacent signal contacts in an adjacent column. The amount of offset may be, for example, a full row pitch (i.e., distance between adjacent rows), half a row pitch, or any other distance that results in acceptably low levels of cross talk for a particular connector design. It has been found that the optimal offset depends on a number of factors, such as column pitch, row pitch, the shape of the terminals, and the dielectric constant(s) of the insulating material(s) around the terminals, for example. It has also been found that the optimal offset is not necessarily "on pitch," as was often thought. That is, the optimal offset may be anywhere along a continuum, and is not limited to whole fractions of a row pitch (e.g., full or half row pitches).

Figure 3A:
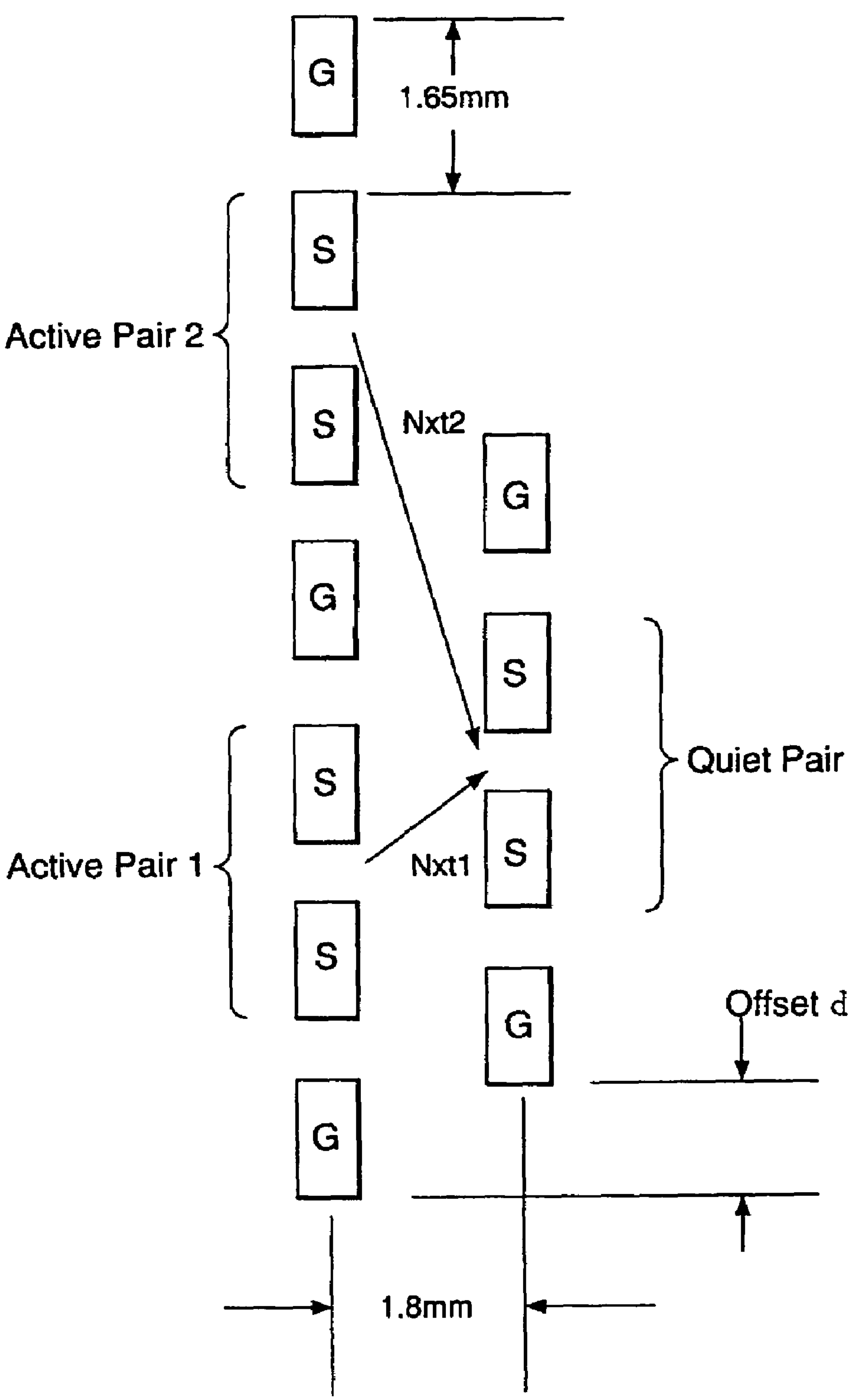
FIG. 3A illustrates a conductor arrangement used to measure the effect of offset on multi-active cross talk.

FIG. 3A illustrates a contact arrangement that has been used to measure the effect of offset between adjacent columns on cross talk. Fast (e.g., 40 ps) rise-time differential signals were applied to each of Active Pair 1 and Active Pair 2. Near-end crosstalk Nxt1 and Nxt2 were determined at Quiet Pair, to which no signal was applied, as the offset d between adjacent columns was varied from 0 to 5.0 mm. Near-end cross talk occurs when noise is induced on the quiet pair from the current carrying contacts in an active pair.

Figure 3B:
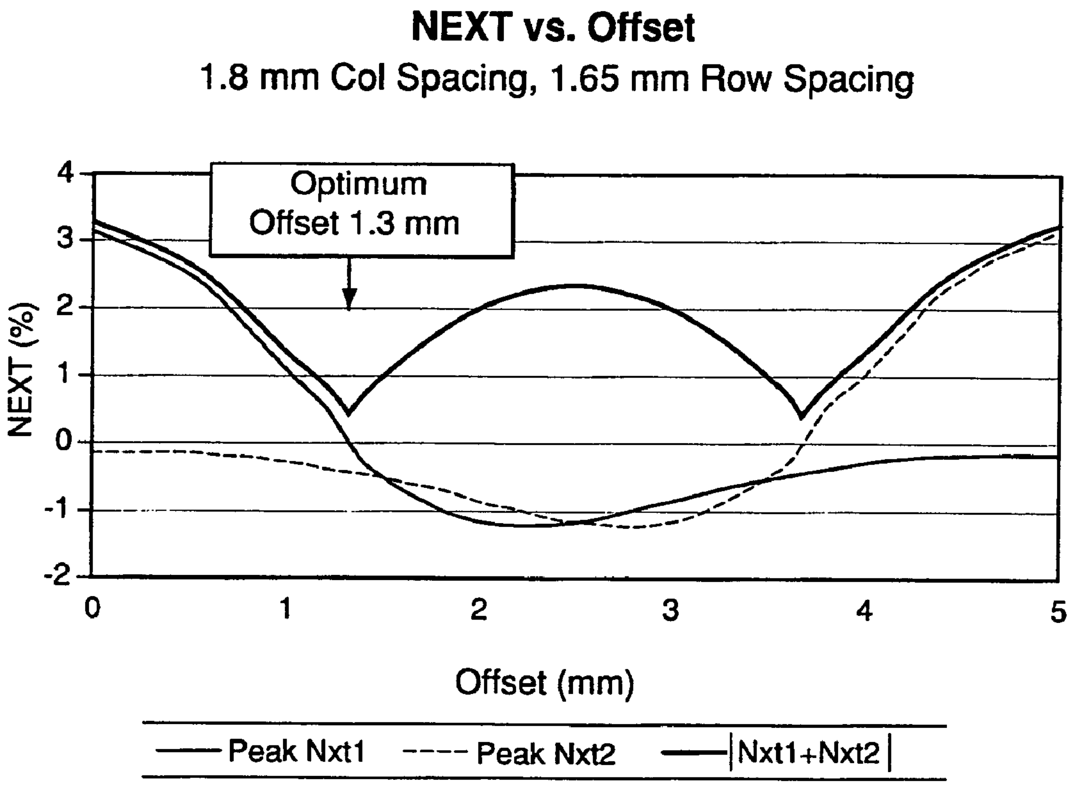
FIG. 3B is a graph illustrating the relationship between multi-active cross talk and offset between adjacent columns of terminals in accordance with one aspect of the invention.

As shown in the graph of FIG. 3B, the incidence of multi-active cross talk (dark line in FIG. 3B) is minimized at offsets of about 1.3 mm and about 3.65 mm. In this experiment, multi-active cross talk was considered to be the sum of the absolute values of cross talk from each of Active Pair 1 (dashed line in FIG. 3B) and Active Pair 2 (thin solid line in FIG. 3B). Thus, it has been shown that adjacent columns can be variably offset relative to one another until an optimum level of cross talk between adjacent pairs (about 1.3 mm, in this example);

d) Through the addition of outer grounds, i.e., the placement of ground contacts at alternating ends of adjacent contact columns, both near-end cross talk ("NEXT") and far-end cross talk ("FEXT") can be further reduced;

e) It has also been found that scaling the contacts (i.e., reducing the absolute dimensions of the contacts while preserving their proportional and geometric relationship) provides for increased contact density (i.e., the number of contacts per linear inch) without adversely affecting the electrical characteristics of the connector.

By considering any or all of these factors, a connector can be designed that delivers high-performance (i.e., low incidence of cross talk), high-speed (e.g., greater than 1 Gb/s and typically about 10 Gb/s) communications even in the absence of shields between adjacent contacts. It should also be understood that such connectors and techniques, which are capable of providing such high speed communications, are also useful at lower speeds. Connectors according to the invention have been shown, in worst case testing scenarios, to have near-end cross talk of less than about 3% and far-end cross talk of less than about 4%, at 40 picosecond rise time, with 63.5 mated signal pairs per linear inch. Such connectors can have insertion losses of less than about 0.7 dB at 5 GHz, and impedance match of about 100±8 ohms measured at a 40 picosecond rise time.

Figure 3C:
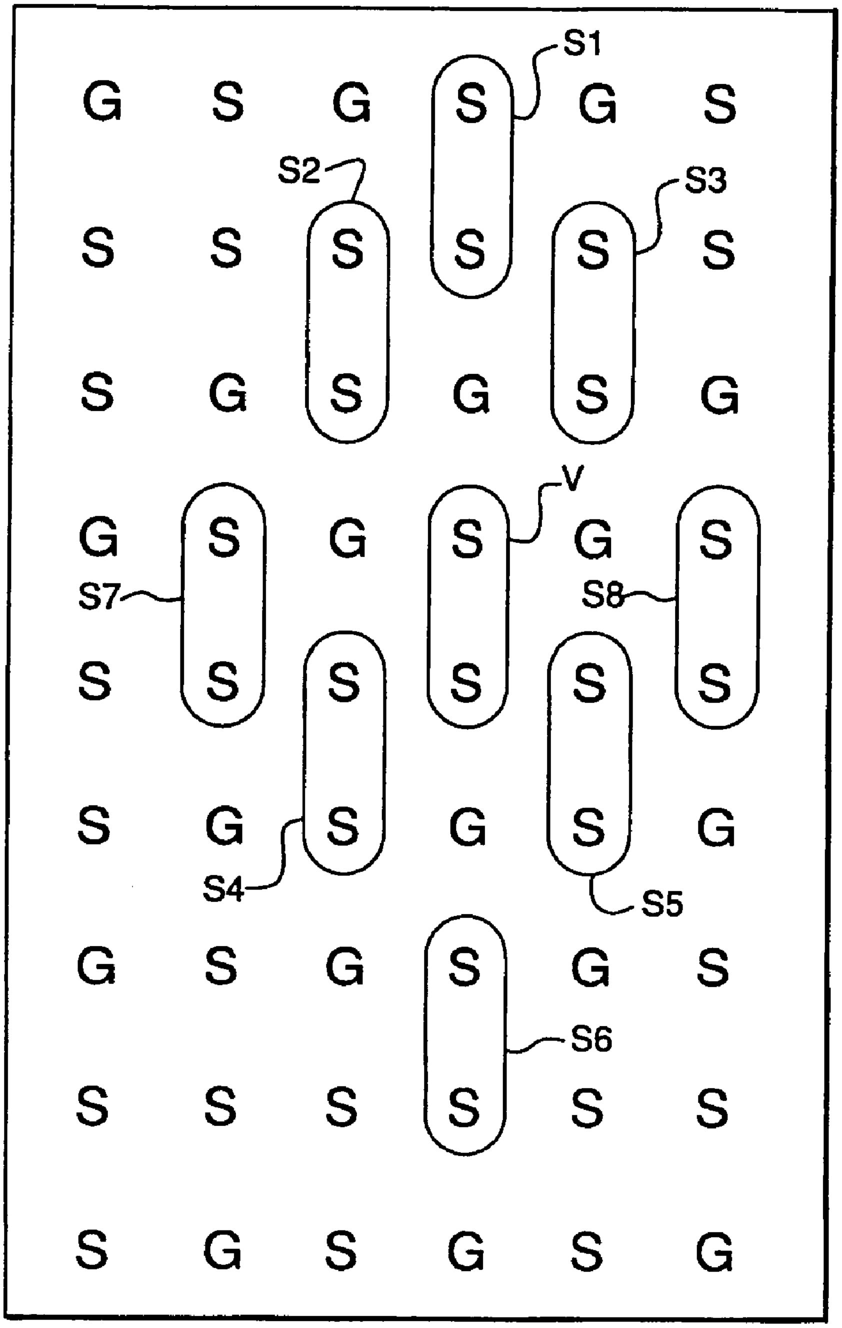
FIG. 3C depicts a contact arrangement for which cross talk was determined in a worst case scenario.

FIG. 3C depicts a contact arrangement for which cross talk was determined in a worst case scenario. Cross talk from each of six attacking pairs S1, S2, S3, S4, S5, and S6 was determined at a "victim" pair V. Attacking pairs S1, S2, S3, S4, S5, and S6 are six of the eight nearest neighboring pairs to signal pair V. It has been determined that the additional affects on cross talk at victim pair V from attacking pairs S7 and S8 is negligible. The combined cross talk from the six nearest neighbor attacking pairs has been determined by summing the absolute values of the peak cross talk from each of the pairs, which assumes that each pair is fairing at the highest level all at the same time. Thus, it should be understood that this is a worst case scenario, and that, in practice, much better results should be achieved.

Exemplary Contact Arrangements According to the Invention

Figure 4A:
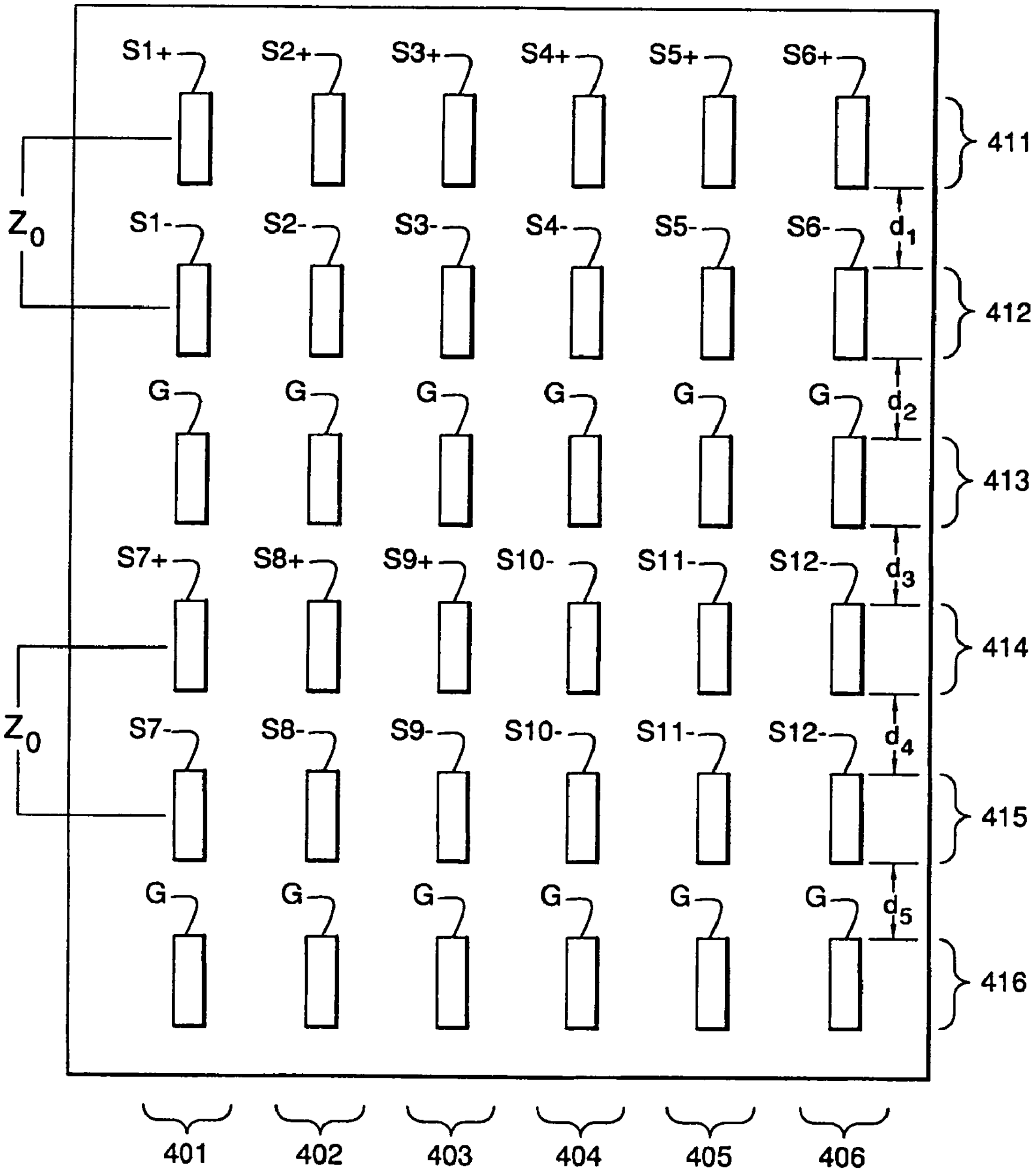
FIGS. 4A–4C depict conductor arrangements in which signal pairs are arranged in columns.

FIG. 4A depicts a connector 100 according to the invention having column-based differential signal pairs (i.e., in which differential signal pairs are arranged into columns). (As used herein, a "column" refers to the direction along which the contacts are edge coupled. A "row" is perpendicular to a column.) As shown, each column 401–406 comprises, in order from top to bottom, a first differential signal pair, a first ground conductor, a second differential signal pair, and a second ground conductor. As can be seen, first column 401 comprises, in order from top to bottom, a first differential signal pair comprising signal conductors S1+ and S1−, a first ground conductor G, a second differential signal pair comprising signal conductors S7+ and S7−, and a second ground conductor G. Each of rows 413 and 416 comprises a plurality of ground conductors G. Rows 411 and 412 together comprise six differential signal pairs, and rows 514 and 515 together comprise another six differential signal pairs. The rows 413 and 416 of ground conductors limit cross talk between the signal pairs in rows 411–412 and the signal pairs in rows 414–415. In the embodiment shown in FIG. 4A, arrangement of 36 contacts into columns can provide twelve differential signal pairs. Because the connector is devoid of shields, the contacts can be made relatively larger (compared to those in a connector having shields). Therefore, less connector space is needed to achieve the desired impedance.

Figure 4B:
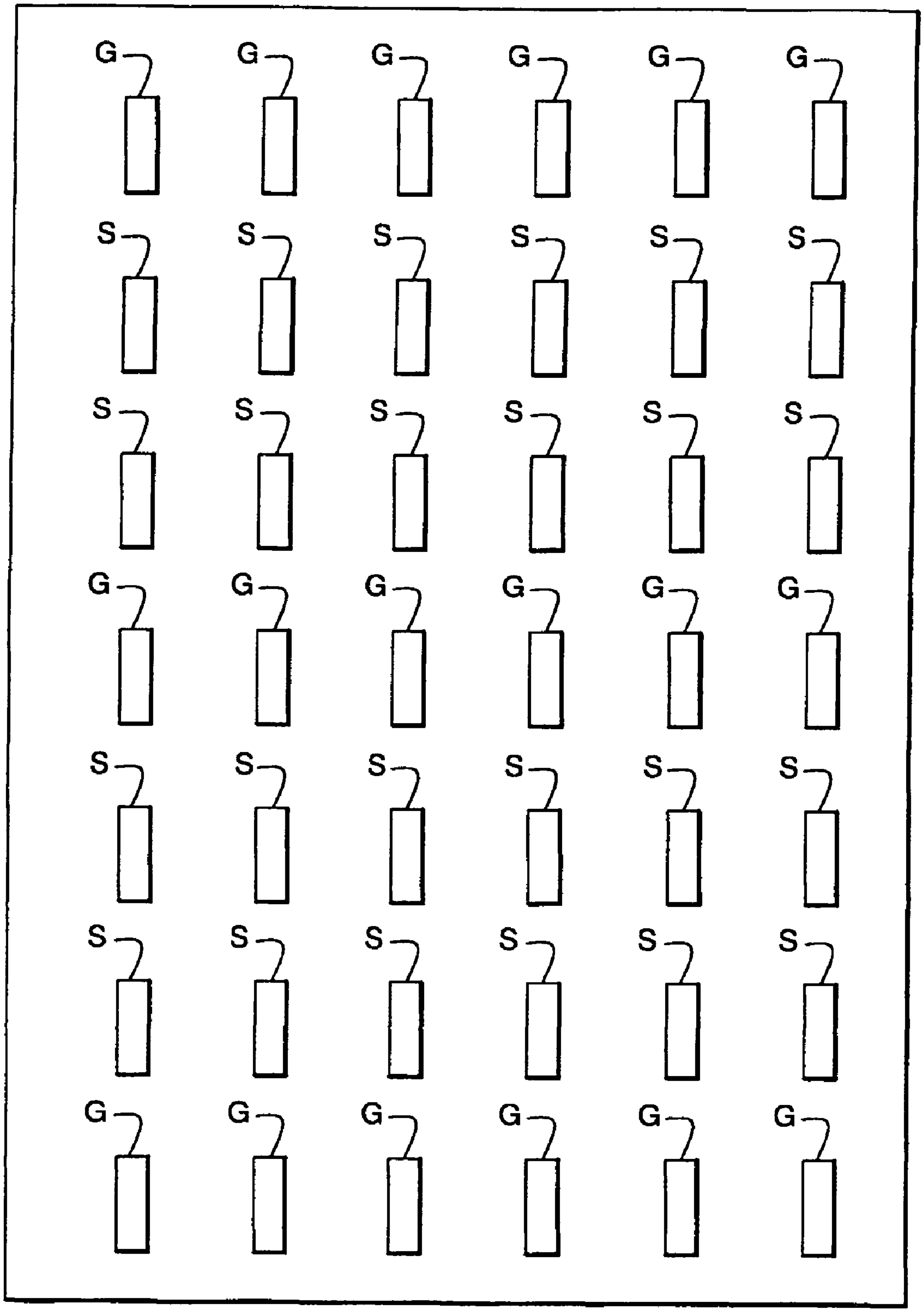
Figure 4C:
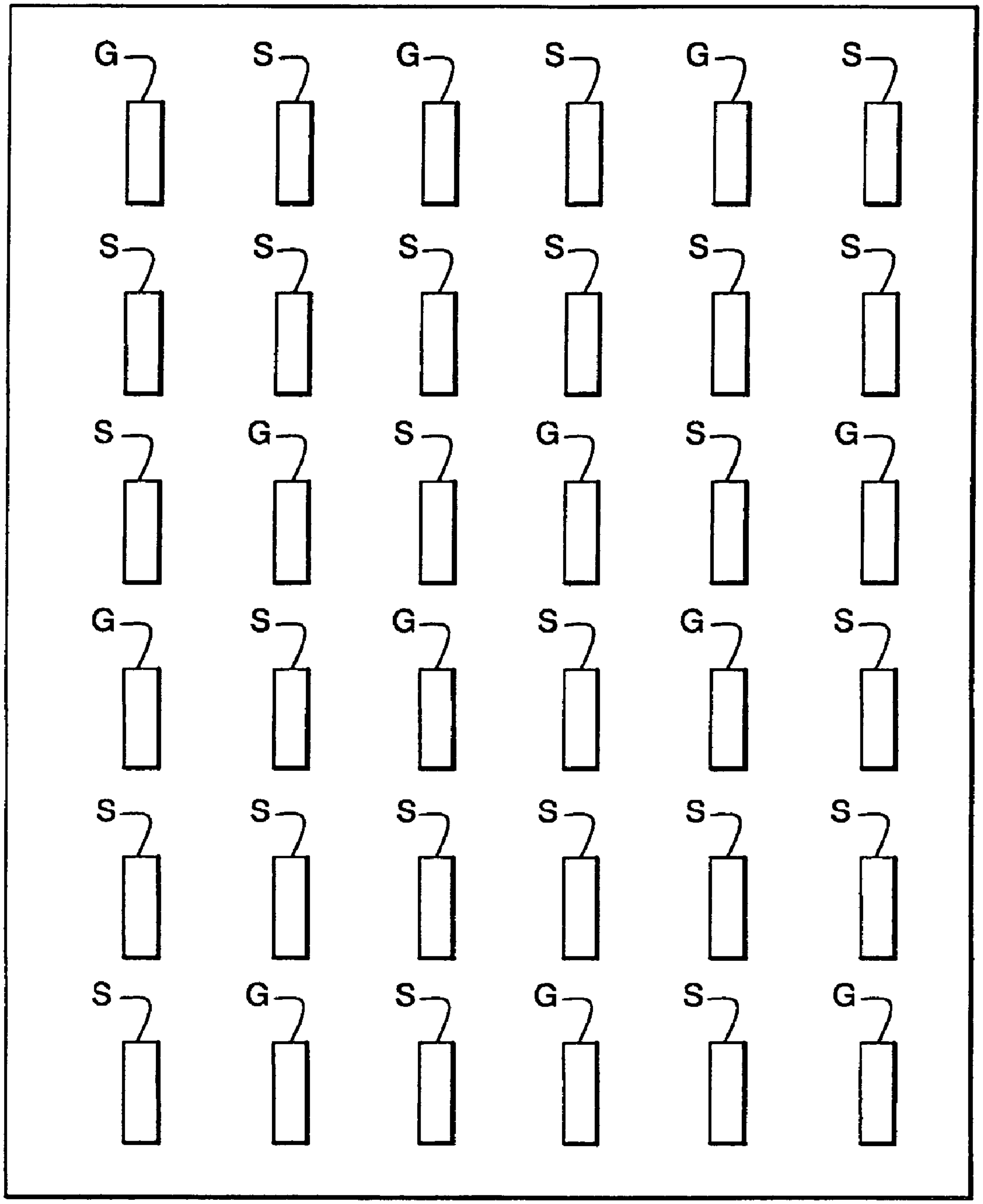

FIGS. 4B and 4C depict connectors according to the invention that include outer grounds. As shown in FIG. 4B, a ground contact G can be placed at each end of each column. As shown in FIG. 4C, a ground contact G can be placed at alternating ends of adjacent columns. It has been found that the placement of a ground contact G at alternating ends of adjacent columns results in a 35% reduction in NEXT and a 65% reduction in FEXT as compared to a connector having a contact arrangement that is otherwise the same, but which has no such outer grounds. It has also been found that basically the same results can be achieved through the placement of ground contacts at both ends of every contact column, as shown in FIG. 4B. Consequently, it is preferred to place outer grounds at alternating ends of adjacent columns in order to increase contact density (relative to a connector in which outer grounds are placed at both ends of every column) without increasing the level of cross talk.

Figure 5:
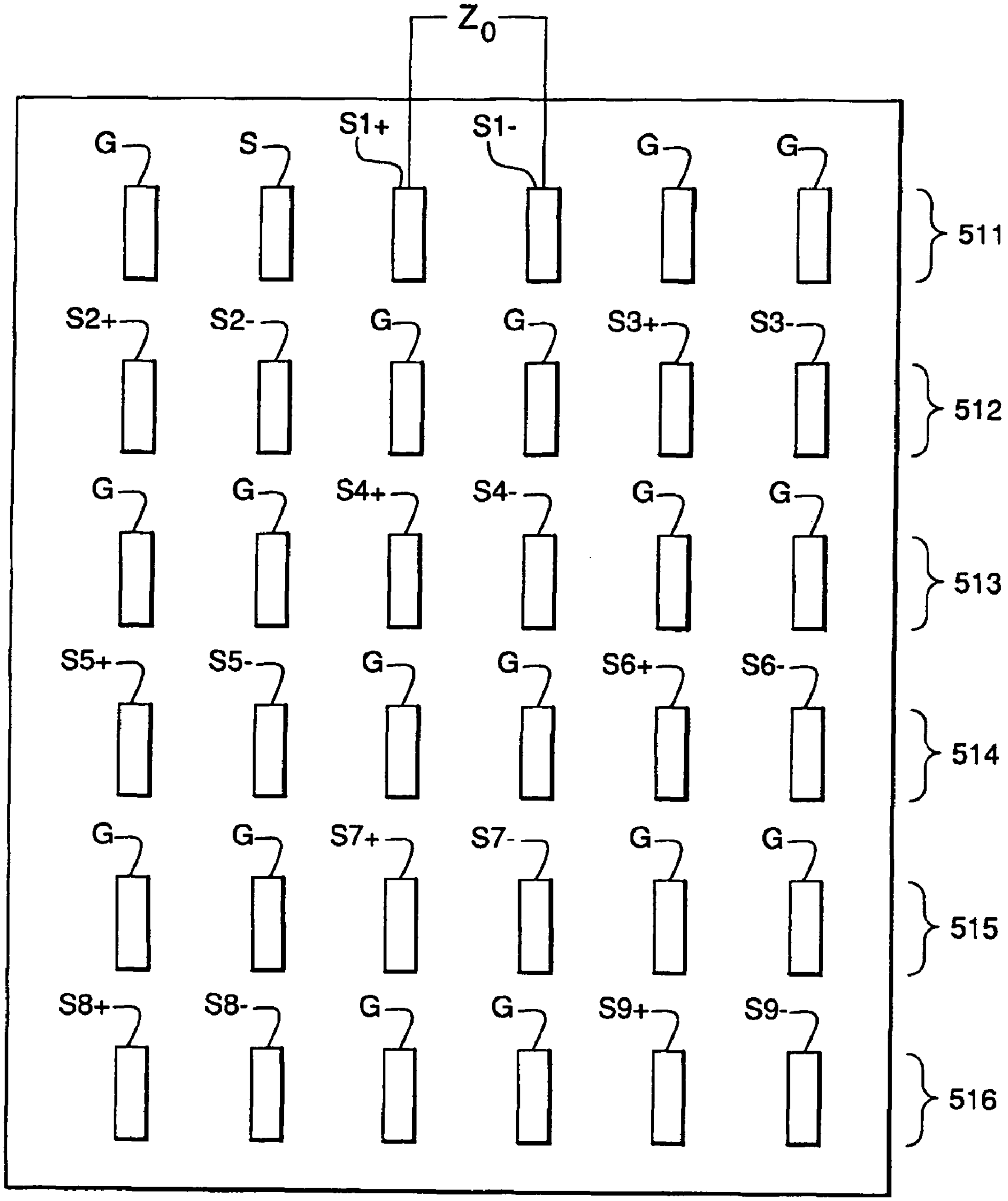
FIG. 5 depicts a conductor arrangement in which signal pairs are arranged in rows.

Alternatively, as shown in FIG. 5, differential signal pairs may be arranged into rows. As shown in FIG. 5, each row 511–516 comprises a repeating sequence of two ground conductors and a differential signal pair. First row 511 comprises, in order from left to right, two ground conductors G, a differential signal pair S1+, S1−, and two ground conductors G. Row 512 comprises in order from left to right, a differential signal pair S2+, S2−, two ground conductors G, and a differential signal pair S3+, S3−. The ground conductors block cross talk between adjacent signal pairs. In the embodiment shown in FIG. 5, arrangement of 36 contacts into rows provides only nine differential signal pairs.

By comparison of the arrangement shown in FIG. 4A with the arrangement shown in FIG. 5, it can be understood that a column arrangement of differential signal pairs results in a higher density of signal contacts than does a row arrangement. However, for right angle connectors arranged into columns, contacts within a differential signal pair have different lengths, and therefore, such differential signal pairs may have intra-pair skew. Similarly, arrangement of signal pairs into either rows or columns may result in inter-pair skew because of the different conductor lengths of different differential signal pairs. Thus, it should be understood that, although arrangement of signal pairs into columns results in a higher contact density, arrangement of the signal pairs into columns or rows can be chosen for the particular application.

Regardless of whether the signal pairs are arranged into rows or columns, each differential signal pair has a differential impedance $Z_0$ between the positive conductor Sx+ and negative conductor Sx− of the differential signal pair. Differential impedance is defined as the impedance existing between two signal conductors of the same differential signal pair, at a particular point along the length of the differential signal pair. As is well known, it is desirable to control the differential impedance $Z_0$ to match the impedance of the electrical device(s) to which the connector is connected. Matching the differential impedance $Z_0$ to the impedance of electrical device minimizes signal reflection and/or system resonance that can limit overall system bandwidth. Furthermore, it is desirable to control the differential impedance $Z_0$ such that it is substantially constant along the length of the differential signal pair, i.e., such that each differential signal pair has a substantially consistent differential impedance profile.

The differential impedance profile can be controlled by the positioning of the signal and ground conductors. Specifically, differential impedance is determined by the proximity of an edge of signal conductor to an adjacent ground and by the gap between edges of signal conductors within a differential signal pair.

As shown in FIG. 4A, the differential signal pair comprising signal conductors S6+ and S6− is located adjacent to one ground conductor G in row 413. The differential signal pair comprising signal conductors S12+ and S12− is located adjacent to two ground conductors G, one in row 413 and one in row 416. Conventional connectors include two ground conductors adjacent to each differential signal pair to minimize impedance matching problems. Removing one of the ground conductors typically leads to impedance mismatches that reduce communications speed. However, the lack of one adjacent ground conductor can be compensated for by reducing the gap between the differential signal pair conductors with only one adjacent ground conductor. For example, as shown in FIG. 4A, signal conductors S6+ and S6− can be located a distance $d_1$ apart from each other and signal conductors S12+ and S12− can be located a different distance $d_2$ apart from each other. The distances may be controlled by making the widths of signal conductors S6+ and S6− wider than the widths of signal conductors S12+ and S12− (where conductor width is measured along the direction of the column).

For single ended signaling, single ended impedance can also be controlled by positioning of the signal and ground conductors. Specifically, single ended impedance is determined by the gap between a signal conductor and an adjacent ground. Single ended impedance is defined as the impedance existing between a signal conductor and ground, at a particular point along the length of a single ended signal conductor.

To maintain acceptable differential impedance control for high bandwidth systems, it is desirable to control the gap between contacts to within a few thousandths of an inch. Gap variations beyond a few thousandths of an inch may cause unacceptable variation in the impedance profile; however, the acceptable variation is dependent on the speed desired, the error rate acceptable, and other design factors.

Figure 6:
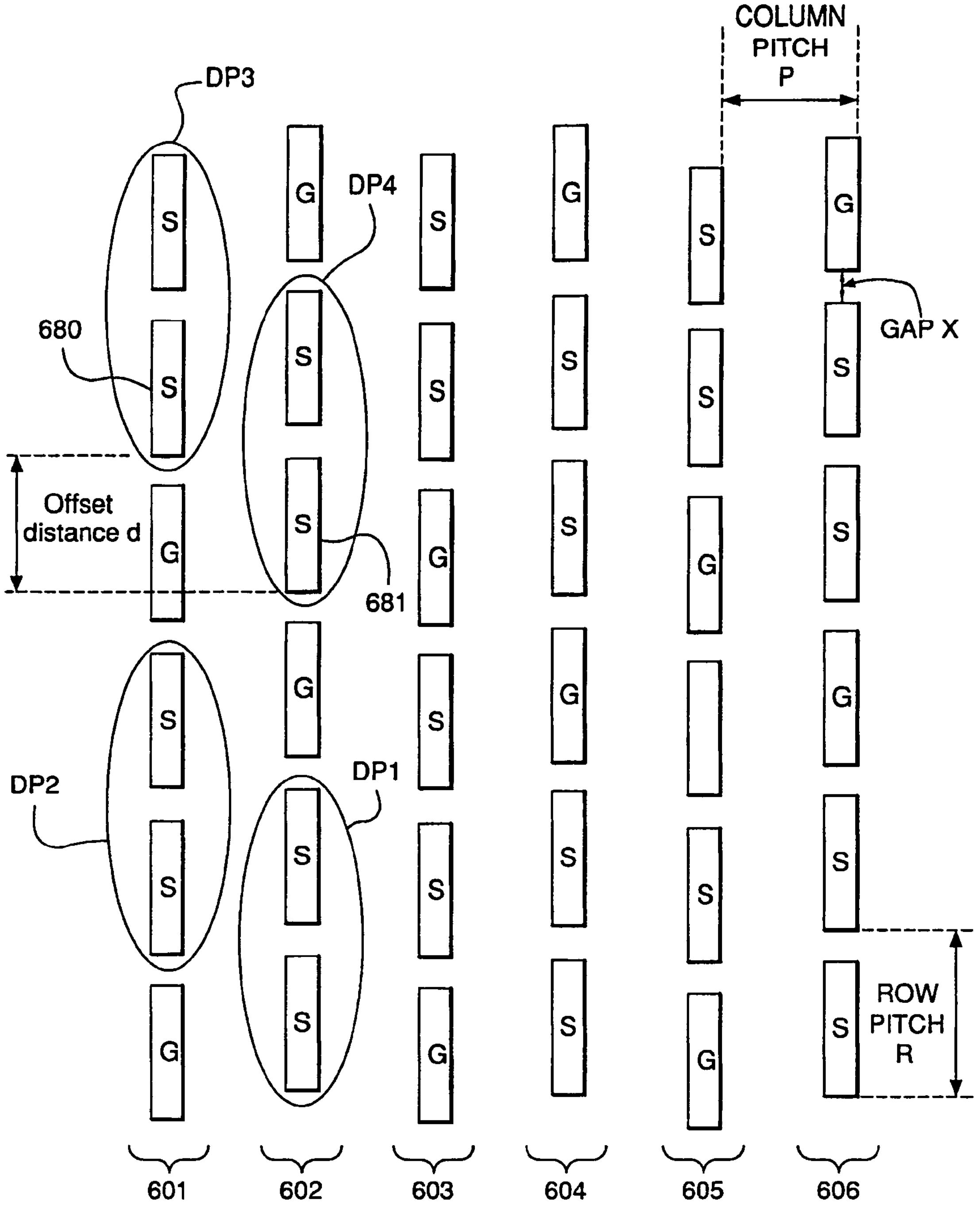
FIG. 6 is a diagram showing an array of six columns of terminals arranged in accordance with one aspect of the invention.

FIG. 6 shows an array of differential signal pairs and ground contacts in which each column of terminals is offset from each adjacent column. The offset is measured from an edge of a terminal to the same edge of the corresponding terminal in the adjacent column. The aspect ratio of column pitch to gap width, as shown in FIG. 6, is P/X. It has been found that an aspect ratio of about 5 (i.e., 2 mm column pitch; 0.4 mm gap width) is adequate to sufficiently limit cross talk where the columns are also staggered. Where the columns are not staggered, an aspect ratio of about 8–10 is desirable.

As described above, by offsetting the columns, the level of multi-active cross talk occurring in any particular terminal can be limited to a level that is acceptable for the particular connector application. As shown in FIG. 6, each column is offset from the adjacent column, in the direction along the columns, by a distance d. Specifically, column 601 is offset from column 602 by an offset distance d, column 602 is offset from column 603 by a distance d, and so forth. Since each column is offset from the adjacent column, each terminal is offset from an adjacent terminal in an adjacent column. For example, signal contact 680 in differential pair DP3 is offset from signal contact 681 in differential pair DP4 by a distance d as shown.

Figure 7:
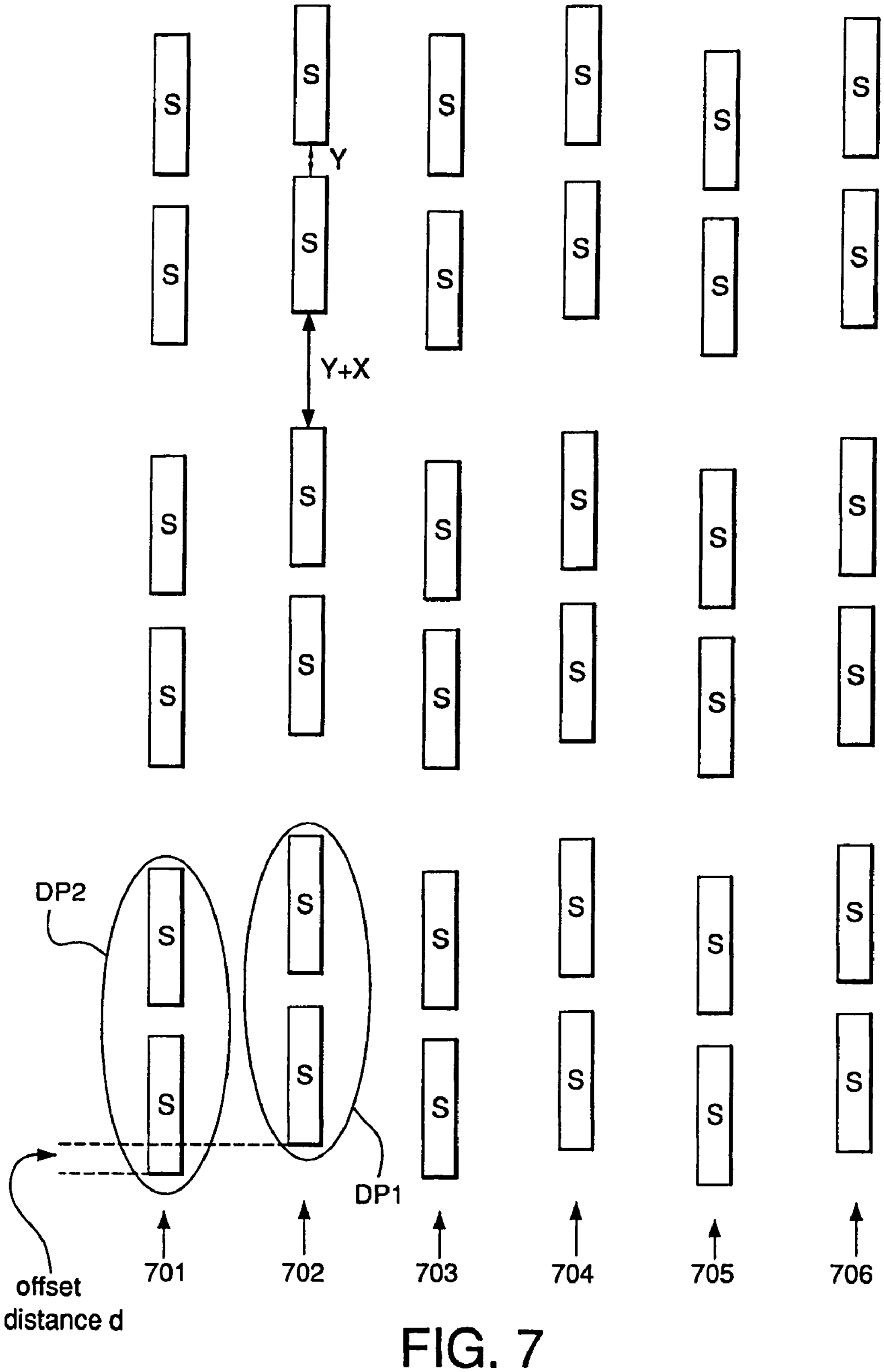
FIG. 7 is a diagram showing an array of six columns arranged in accordance with another embodiment of the invention.

FIG. 7 illustrates another configuration of differential pairs wherein each column of terminals is offset relative to adjacent columns. For example, as shown, differential pair DP1 in column 701 is offset from differential pair DP2 in the adjacent column 702 by a distance d. In this embodiment, however, the array of terminals does not include ground contacts separating each differential pair. Rather, the differential pairs within each column are separated from each other by a distance greater than the distance separating one terminal in a differential pair from the second terminal in the same differential pair. For example, where the distance between terminals within each differential pair is Y, the distance separating differential pairs can be Y+X, where Y+X/Y >>1. It has been found that such spacing also serves to reduce cross talk.

Exemplary Connector Systems According to the Invention

Figure 8:
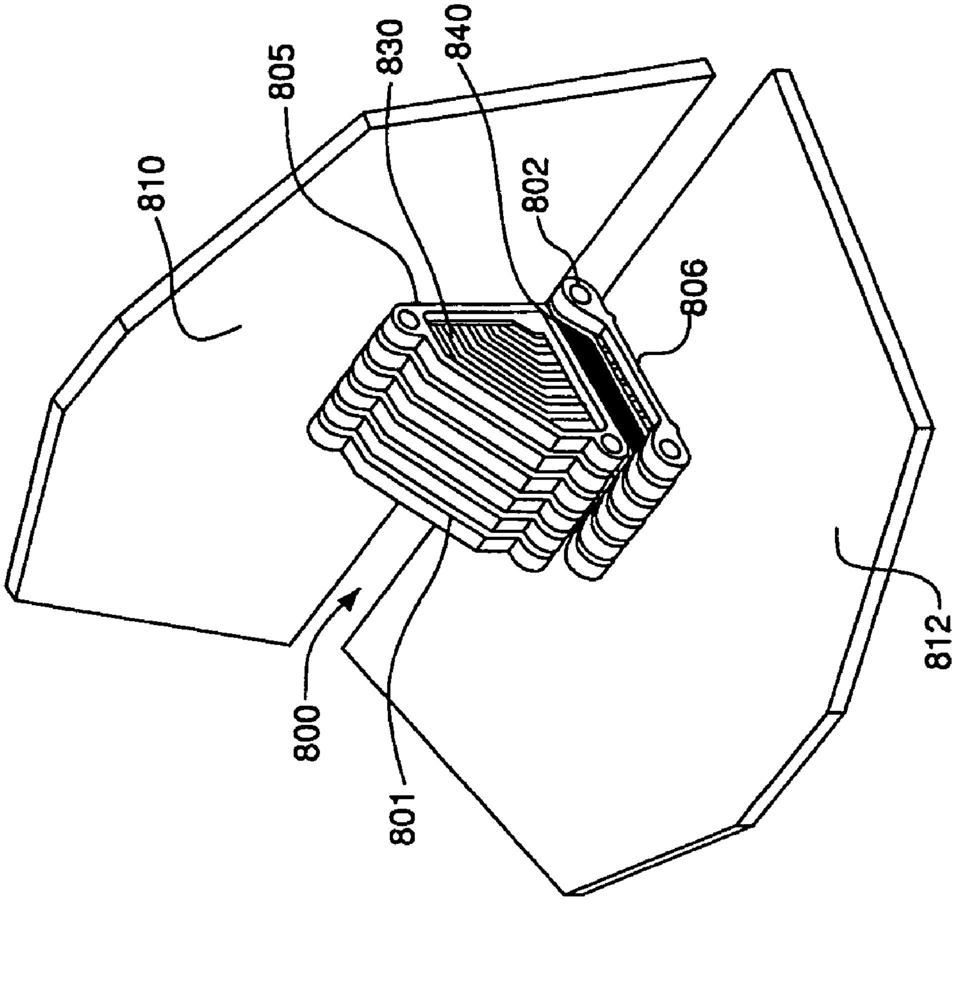
FIG. 8 is a perspective view of an illustrative right angle electrical connector, in accordance with the invention.

FIG. 8 is a perspective view of a right angle electrical connector according to the invention that is directed to a high speed electrical connector wherein signal conductors of a differential signal pair have a substantially constant differential impedance along the length of the differential signal pair. As shown in FIG. 8, a connector 800 comprises a first section 801 and a second section 802. First section 801 is electrically connected to a first electrical device 810 and second section 802 is electrically connected to a second electrical device 812. Such connections may be SMT, PIP, solder ball grid array, press fit, or other such connections. Typically, such connections are conventional connections having conventional connection spacing between connection pins; however, such connections may have other spacing between connection pins. First section 801 and second section 802 can be electrically connected together, thereby electrically connecting first electrical device 810 to second electrical device 812.

As can be seen, first section 801 comprises a plurality of modules 805. Each module 805 comprises a column of conductors 830. As shown, first section 801 comprises six modules 805 and each module 805 comprises six conductors 830; however, any number of modules 805 and conductors 830 may be used. Second section 802 comprises a plurality of modules 806. Each module 806 comprises a column of conductors 840. As shown, second section 802 comprises six modules 806 and each module 806 comprises six conductors 840; however, any number of modules 806 and conductors 840 may be used.

Figure 9:
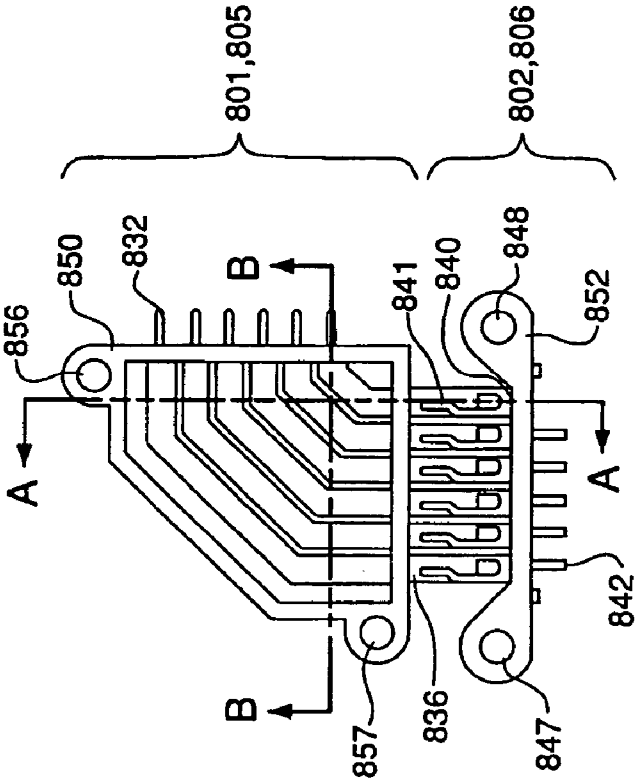
FIG. 9 is a side view of the right angle electrical connector of FIG. 8.

FIG. 9 is a side view of connector 800. As shown in FIG. 9, each module 805 comprises a plurality of conductors 830 secured in a frame 850. Each conductor 830 comprises a connection pin 832 extending from frame 850 for connection to first electrical device 810, a blade 836 extending from frame 850 for connection to second section 802, and a conductor segment 834 connecting connection pin 832 to blade 836.

Each module 806 comprises a plurality of conductors 840 secured in frame 852. Each conductor 840 comprises a contact interface 841 and a connection pin 842. Each contact interface 841 extends from frame 852 for connection to a blade 836 of first section 801. Each contact interface 840 is also electrically connected to a connection pin 842 that extends from frame 852 for electrical connection to second electrical device 812.

Each module 805 comprises a first hole 856 and a second hole 857 for alignment with an adjacent module 805. Thus, multiple columns of conductors 830 may be aligned. Each module 806 comprises a first hole 847 and a second hole 848 for alignment with an adjacent module 806. Thus, multiple columns of conductors 840 may be aligned.

Module 805 of connector 800 is shown as a right angle module. That is, a set of first connection pins 832 is positioned on a first plane (e.g., coplanar with first electrical device 810) and a set of second connection pins 842 is positioned on a second plane (e.g., coplanar with second electrical device 812) perpendicular to the first plane. To connect the first plane to the second plane, each conductor 830 turns a total of about ninety degrees (a right angle) to connect between electrical devices 810 and 812.

To simplify conductor placement, conductors 830 can have a rectangular cross section; however, conductors 830 may be any shape. In this embodiment, conductors 830 have a high ratio of width to thickness to facilitate manufacturing. The particular ratio of width to thickness may be selected based on various design parameters including the desired communication speed, connection pin layout, and the like.

Figure 10:
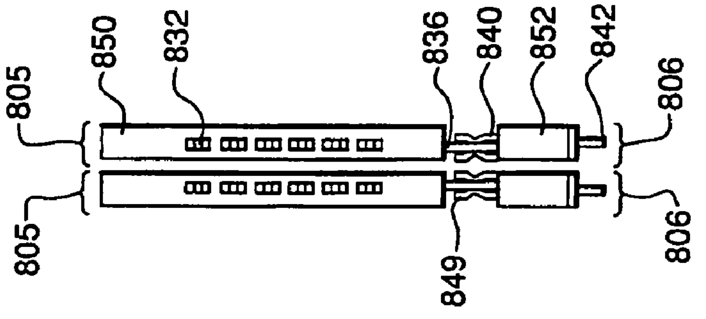
FIG. 10 is a side view of a portion of the right angle electrical connector of FIG. 8 taken along line A—A.
Figure 11:
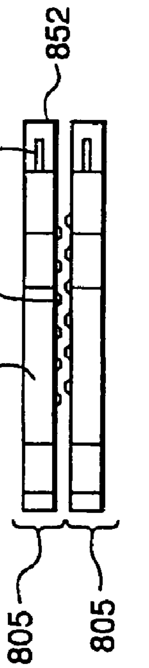
FIG. 11 is a top view of a portion of the right angle electrical connector of FIG. 8 taken along line B—B.

FIG. 10 is a side view of two modules of connector 800 taken along line A—A and FIG. 11 is a top view of two modules of connector 800 taken along line B—B. As can be seen, each blade 836 is positioned between two single beam contacts 849 of contact interface 841, thereby providing electrical connection between first section 801 and second section 802 and described in more detail below. Connection pins 832 are positioned proximate to the centerline of module 805 such that connection pins 832 may be mated to a device having conventional connection spacing. Connection pins 842 are positioned proximate to the centerline of module 806 such that connection pins 842 may be mated to a device having conventional connection spacing. Connection pins, however, may be positioned at an offset from the centerline of module 806 if such connection spacing is supported by the mating device. Further, while connection pins are illustrated in the Figures, other connection techniques are contemplated such as, for example, solder balls and the like.

Returning now to illustrative connector 800 of FIG. 8 to discuss the layout of connection pins and conductors, first section 801 of connector 800 comprises six columns and six rows of conductors 830. Conductors 830 may be either signal conductors S or ground conductors G. Typically, each signal conductor S is employed as either a positive conductor or a negative conductor of a differential signal pair; however, a signal conductor may be employed as a conductor for single ended signaling. In addition, such conductors 830 may be arranged in either columns or rows.

In addition to conductor placement, differential impedance and insertion losses are also affected by the dielectric properties of material proximate to the conductors. Generally, it is desirable to have materials having very low dielectric constants adjacent and in contact with as much as the conductors as possible. Air is the most desirable dielectric because it allows for a lightweight connector and has the best dielectric properties. While frame 850 and frame 852 may comprise a polymer, a plastic, or the like to secure conductors 830 and 840 so that desired gap tolerances may be maintained, the amount of plastic used is minimized. Therefore, the rest of connector comprises an air dielectric and conductors 830 and 840 are positioned both in air and only minimally in a second material (e.g., a polymer) having a second dielectric property. Therefore, to provide a substantially constant differential impedance profile, in the second material, the spacing between conductors of a differential signal pair may vary.

As shown, the conductors can be exposed primarily to air rather than being encased in plastic. The use of air rather than plastic as a dielectric provides a number of benefits. For example, the use of air enables the connector to be formed from much less plastic than conventional connectors. Thus, a connector according to the invention can be made lower in weight than convention connectors that use plastic as the dielectric. Air also allows for smaller gaps between contacts and thereby provides for better impedance and cross talk control with relatively larger contacts, reduces cross-talk, provides less dielectric loss, increases signal speed (i.e., less propagation delay).

Through the use of air as the primary dielectric, a lightweight, low-impedance, low cross talk connector can be provided that is suitable for use as a ball grid assembly ("BGA") right-angle connector. Typically, a right angle connector is "off-balance, i.e., disproportionately heavy in the mating area. Consequently, the connector tends to "tilt" in the direction of the mating area. Because the solder balls of the BGA, while molten, can only support a certain mass, prior art connectors typically are unable to include additional mass to balance the connector. Through the use of air, rather than plastic, as the dielectric, the mass of the connector can be reduced. Consequently, additional mass can be added to balance the connector without causing the molten solder balls to collapse.

Figure 12:
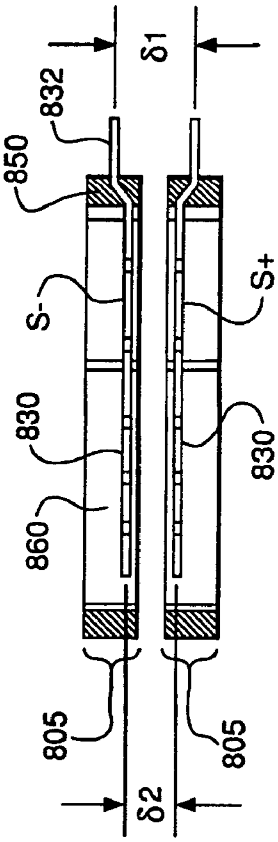
FIG. 12 is a top cut-away view of conductors of the right angle electrical connector of FIG. 8 taken along line B—B.

FIG. 12 illustrates the change in spacing between conductors in rows as conductors pass from being surrounded by air to being surrounded by frame 850. As shown in FIG. 12, at connection pin 832 the distance between conductor S+ and S− is δ1. Distance δ1 may be selected to mate with conventional connector spacing on first electrical device 810 or may be selected to optimize the differential impedance profile. As shown, distance δ1 is selected to mate with a conventional connector and is disposed proximate to the centerline of module 805. As conductors S+ and S− travel from connection pins 832 through frame 850, portions 833 of conductors S+, S− jog towards each other, culminating in a separation distance δ2 in air region 860. Distance δ2 is selected to give the desired differential impedance between conductor S+ and S−, given other parameters, such as proximity to a ground conductor G. For example, given a spacing δ1, spacing δ2 may be chosen to provide for a constant differential impedance Z along the length of the conductor S+, S−. The desired differential impedance $Z_0$ depends on the system impedance (e.g., of first electrical device 810), and may be 100 ohms or some other value. Typically, a tolerance of about 5 percent is desired; however, 10 percent may be acceptable for some applications. It is this range of 10% or less that is considered substantially constant differential impedance.

Figure 13A:
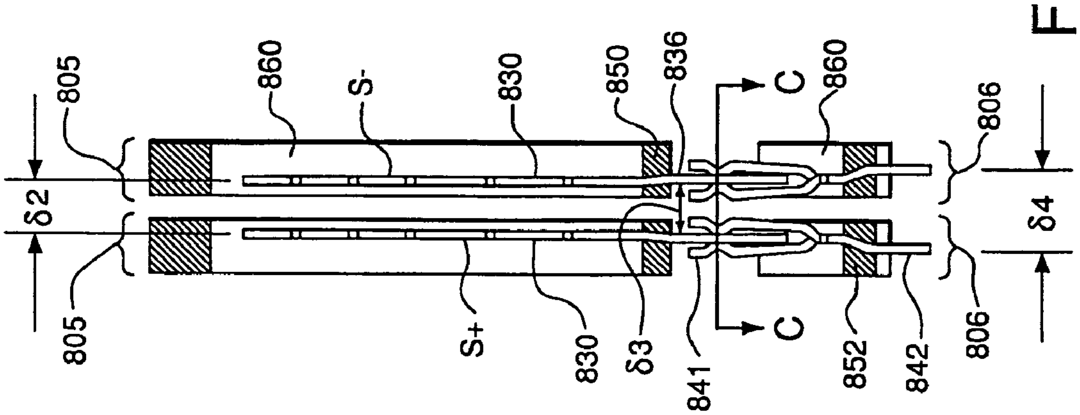
FIG. 13A is a side cut-away view of a portion of the right angle electrical connector of FIG. 8 taken along line A—A.

As shown in FIG. 13A, conductors S+ and S− are disposed from air region 860 towards blade 836 and portions 835 jog outward with respect to each other within frame 850 such that blades 836 are separated by a distance δ3 upon exiting frame 850. Blades 836 are received in contact interfaces 841, thereby providing electrical connection between first section 801 and second section 802. As contact interfaces 841 travel from air region 860 towards frame 852, contact interfaces 841 jog outwardly with respect to each other, culminating in connection pins 842 separated by a distance of δ4. As shown, connection pins 842 are disposed proximate to the centerline of frame 852 to mate with conventional connector spacing.

Figure 14:
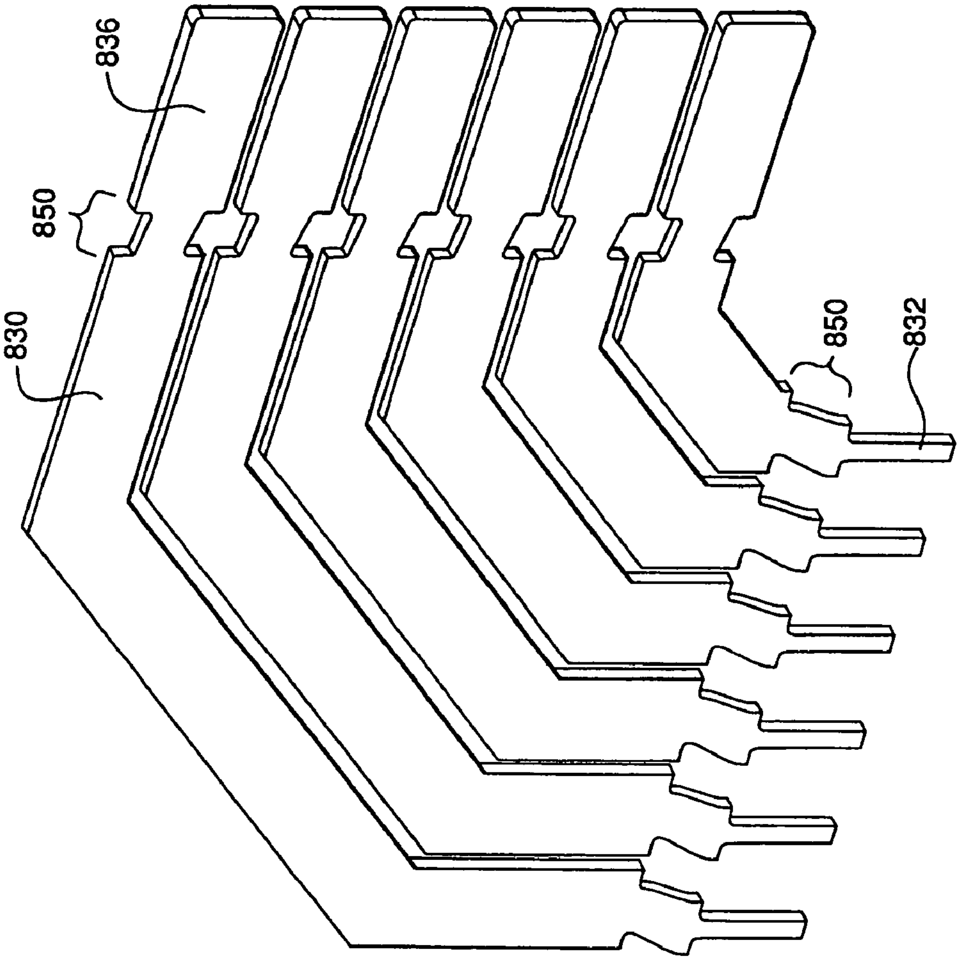
FIG. 14 is a perspective view of illustrative conductors of a right angle electrical connector according to the invention.

FIG. 14 is a perspective view of conductors 830. As can be seen, within frame 850, conductors 830 jog, either inwardly or outwardly to maintain a substantially constant differential impedance profile along the conductive path.

Figure 15:
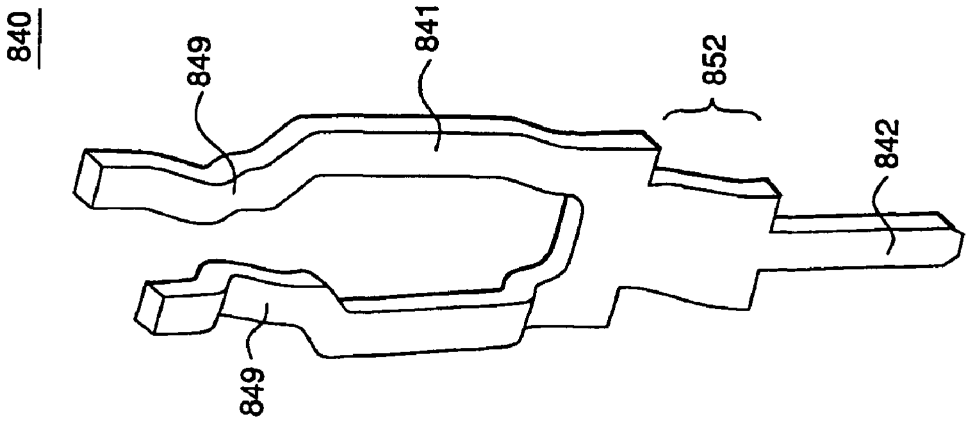
FIG. 15 is a perspective view of another illustrative conductor of the right angle electrical connector of FIG. 8.

FIG. 15 is a perspective view of conductor 840 that includes two single beam contacts 849, one beam contact 849 on each side of blade 836. This design may provide reduced cross talk performance, because each single beam contact 849 is further away from its adjacent contact. Also, this design may provide increased contact reliability, because it is a “true” dual contact. This design may also reduce the tight tolerance requirements for the positioning of the contacts and forming of the contacts.

As can be seen, within frame 852, conductor 840 jogs, either inward or outward to maintain a substantially constant differential impedance profile and to mate with connectors on second electrical device 812. For arrangement into columns, conductors 830 and 840 are positioned along a centerline of frames 850, 852, respectively.

Figure 13B:
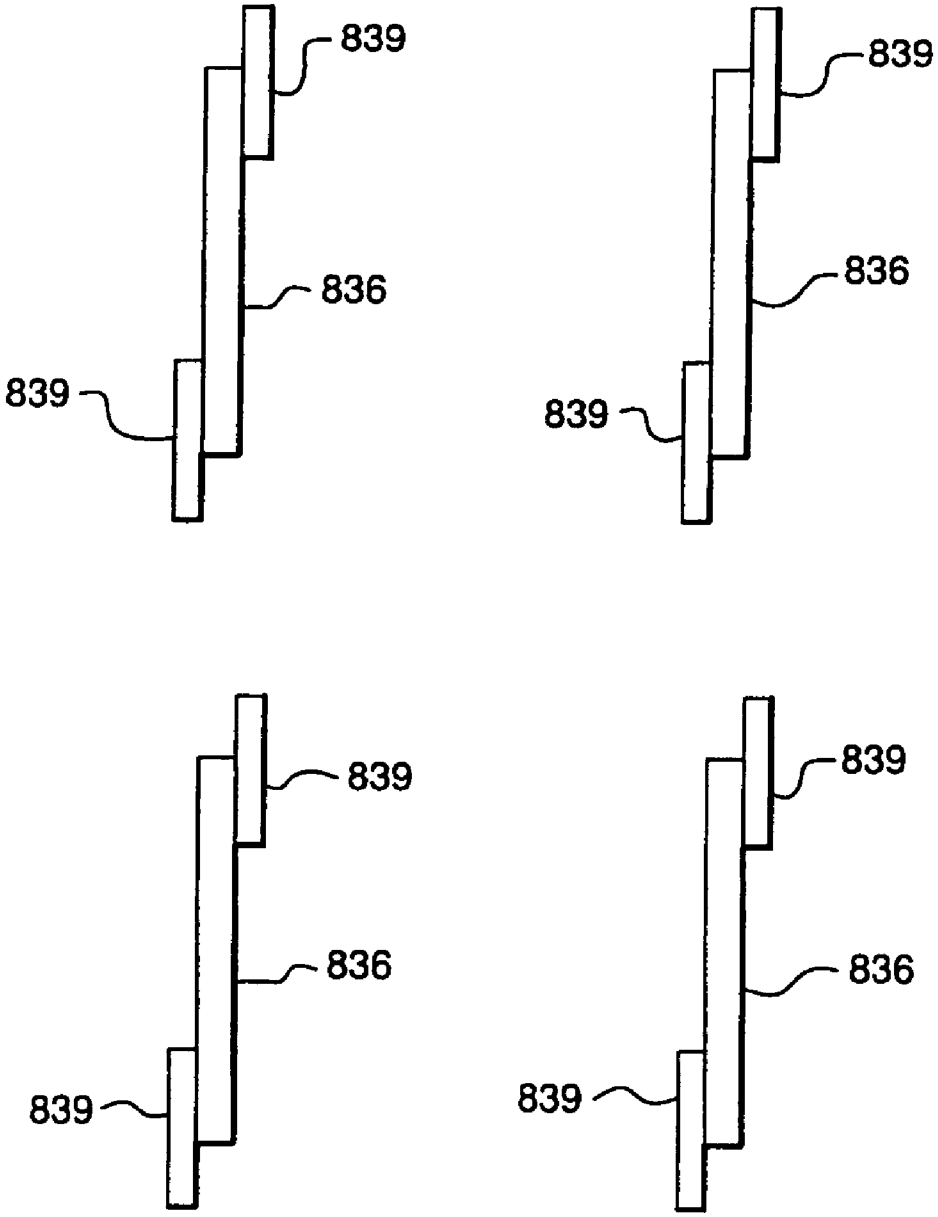
FIG. 13B is a cross-sectional view taken along line C—C of FIG. 13A.

FIG. 13B is a cross-sectional view taken along line C—C of FIG. 13A. As shown in FIG. 13B, terminal blades 836 are received in contact interfaces 841 such that beam contacts 839 engage respective sides of blades 836. Preferably, the beam contacts 839 are sized and shaped to provide contact between the blades 836 and the contact interfaces 841 over a combined surface area that is sufficient to maintain the electrical characteristics of the connector during mating and unmating of the connector.

As shown in FIG. 13B, the contact design allows the edge-coupled aspect ratio to be maintained in the mating region. That is, the aspect ratio of column pitch to gap width chosen to limit cross talk in the connector, exists in the contact region as well, and thereby limits cross talk in the mating region. Also, because the cross-section of the unmated blade contact is nearly the same as the combined cross-section of the mated contacts, the impedance profile can be maintained even if the connector is partially unmated. This occurs, at least in part, because the combined cross-section of the mated contacts includes no more than one or two thickness of metal (the thicknesses of the blade and the contact interface), rather than three thicknesses as would be typical in prior art connectors (see FIG. 13B, for example). Unplugging a connector such as shown in FIG. 13B results in a significant change in cross-section, and therefore, a significant change in impedance (which causes significant degradation of electrical performance if the connector is not properly and completely mated). Because the contact cross-section does not change dramatically as the connector is unmated, the connector (as shown in FIG. 13A) can provide nearly the same electrical characteristics when partially unmated (i.e., unmated by about 1–2 mm) as it does when fully mated.

Figure 16A:
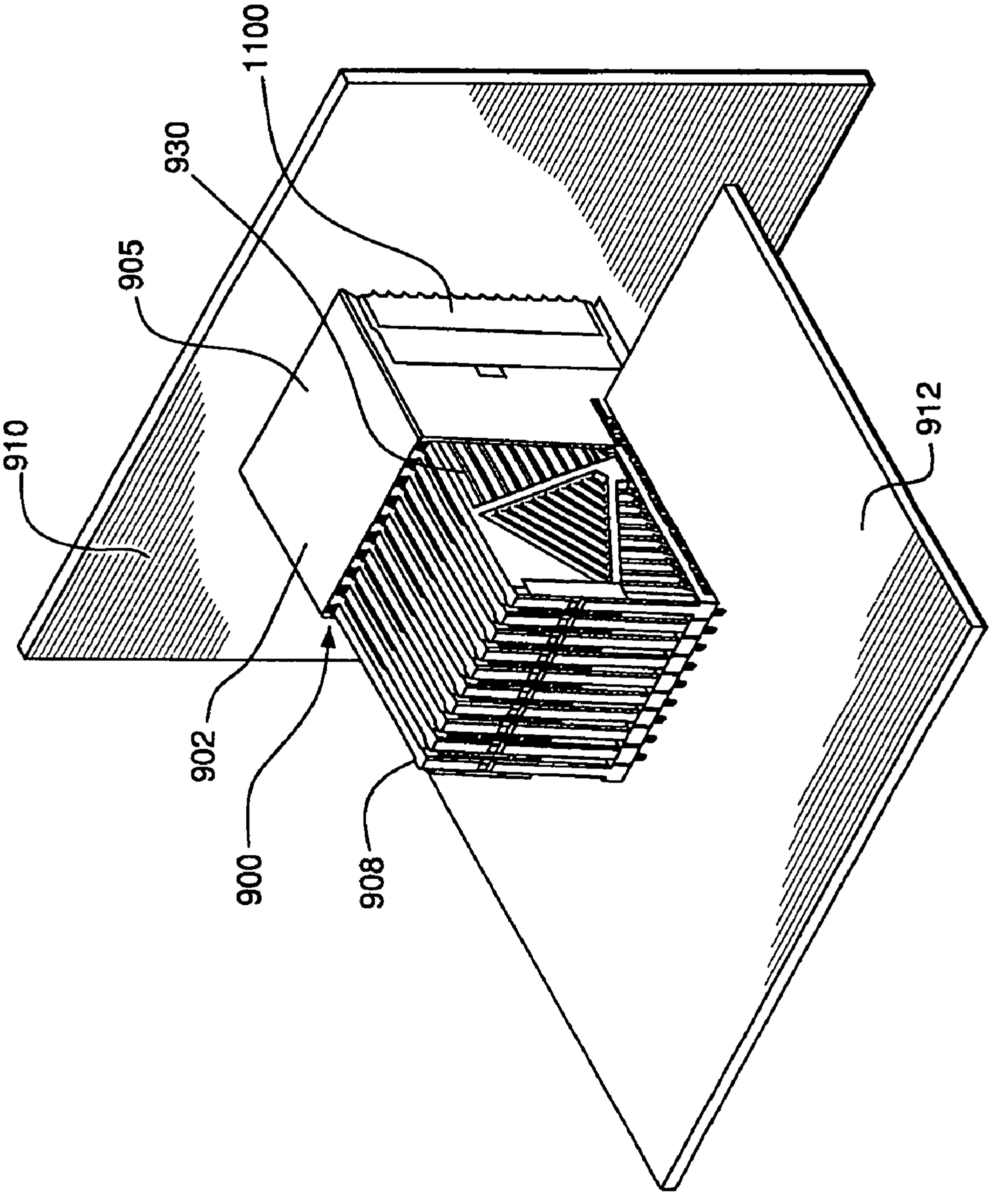
FIG. 16A is a perspective view of a backplane system having an exemplary right angle electrical connector.

FIG. 16A is a perspective view of a backplane system having an exemplary right angle electrical connector in accordance with an embodiment of the invention. As shown in FIG. 16A, connector 900 comprises a plug 902 and receptacle 1100.

Plug 902 comprises housing 905 and a plurality of lead assemblies 908. The housing 905 is configured to contain and align the plurality of lead assemblies 908 such that an electrical connection suitable for signal communication is made between a first electrical device 910 and a second electrical device 912 via receptacle 1100. In one embodiment of the invention, electrical device 910 is a backplane and electrical device 912 is a daughtercard. Electrical devices 910 and 912 may, however, be any electrical device without departing from the scope of the invention.

As shown, the connector 902 comprises a plurality of lead assemblies 908. Each lead assembly 908 comprises a column of terminals or conductors 930 therein as will be described below. Each lead assembly 908 comprises any number of terminals 930.

Figure 16B:
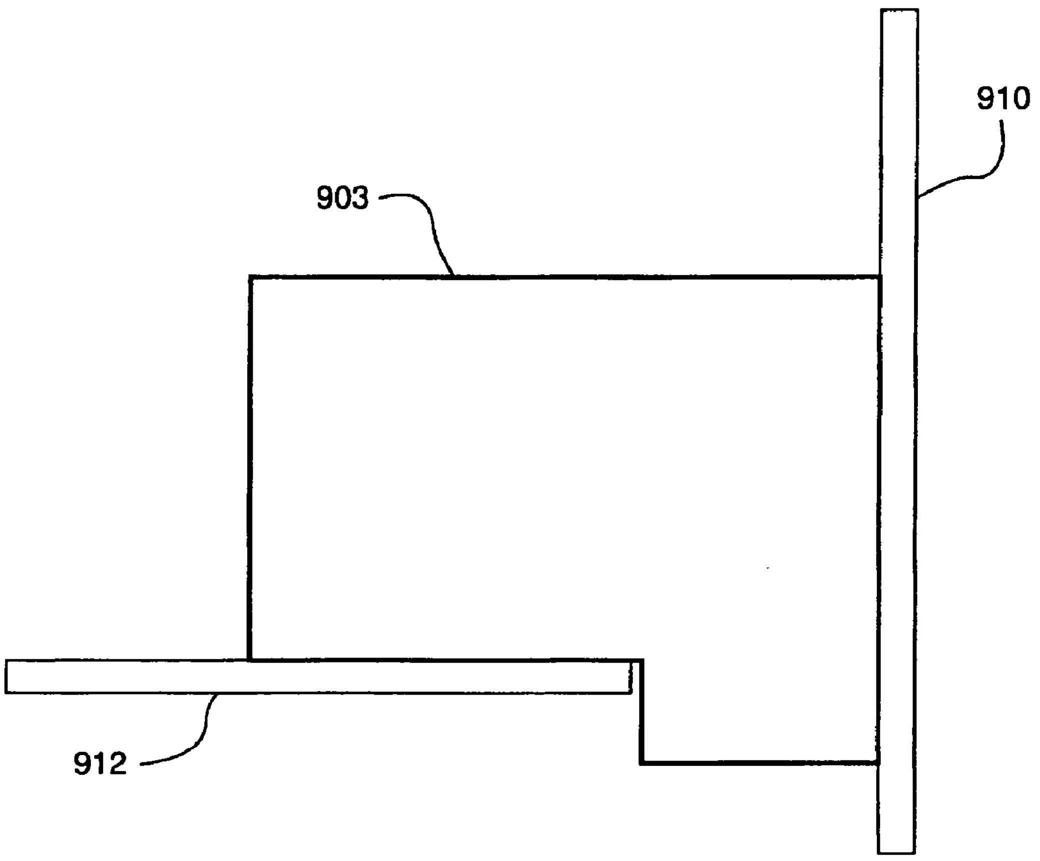
FIG. 16B is a simplified view of an alternative embodiment of a backplane system with a right angle electrical connector.

FIG. 16B is backplane system similar to FIG. 16A except that the connector 903 is a single device rather than mating plug and receptacle. Connector 903 comprises a housing and a plurality of lead assemblies (not shown). The housing is configured to contain and align the plurality of lead assemblies (not shown) such that an electrical connection suitable for signal communication is made between a first electrical device 910 and a second electrical device 912

Figure 16C:
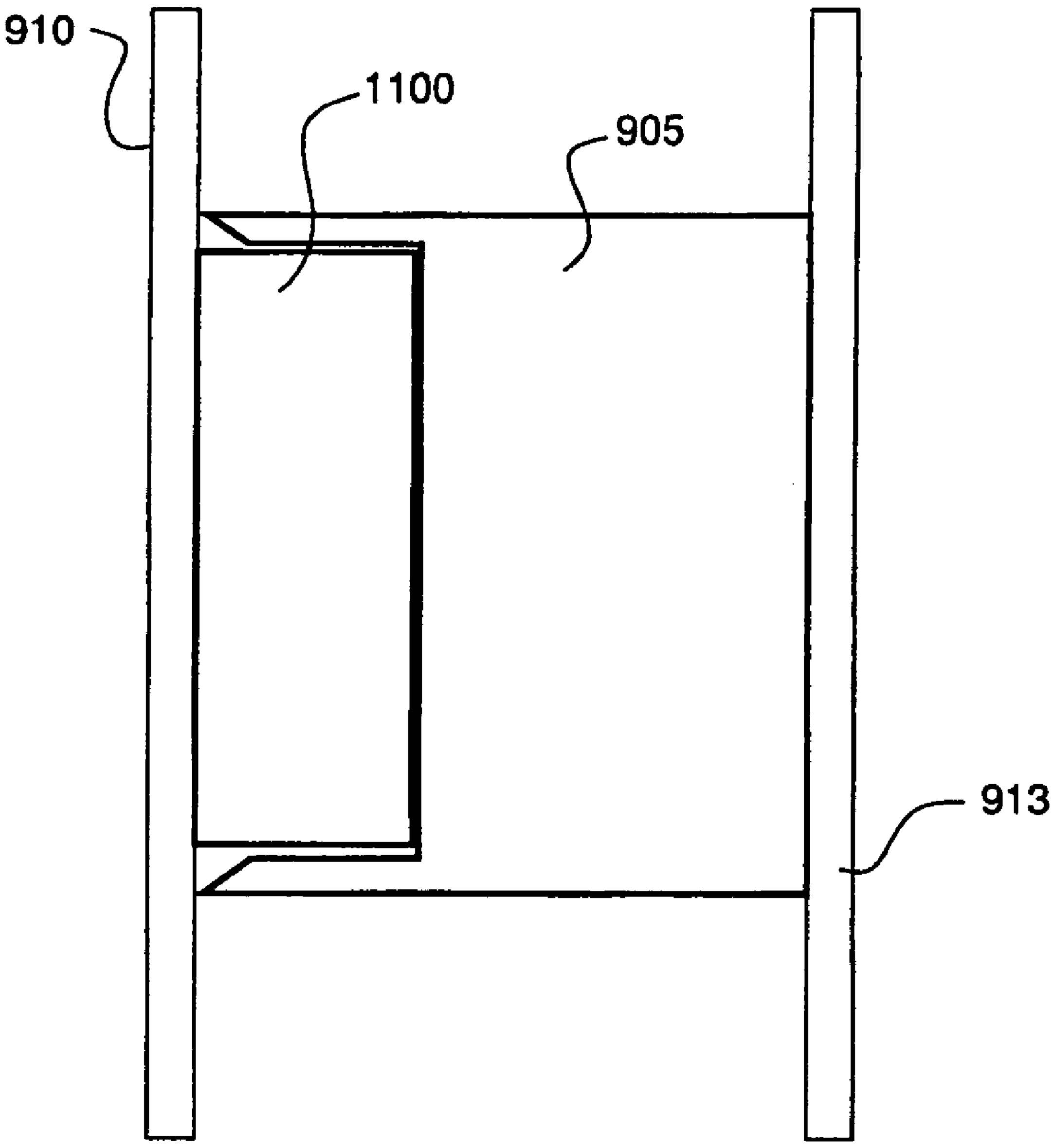
FIG. 16C is a simplified view of a board-to-board system having a vertical connector.

FIG. 16C is a board-to-board system similar to FIG. 16A except that plug connector 905 is a vertical plug connector rather than a right angle plug connector. This embodiment makes electrical connection between two parallel electrical devices 910 and 913. A vertical back-panel receptacle connector according to the invention can be insert molded onto a board, for example. Thus, spacing, and therefore performance, can be maintained.

Figure 17:
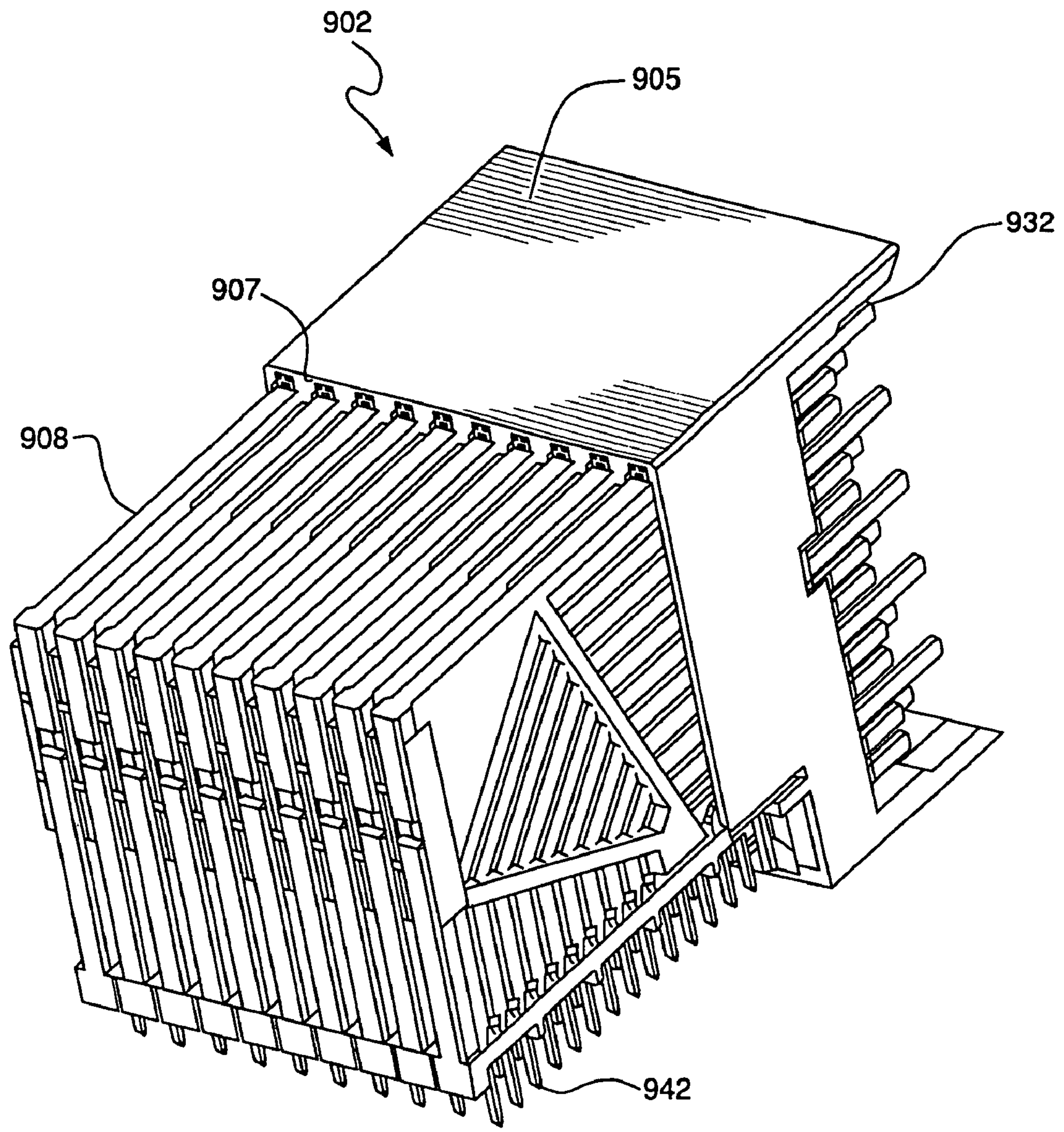
FIG. 17 is a perspective view of the connector plug portion of the connector shown in FIG. 16A.

FIG. 17 is a perspective view of the plug connector of FIG. 16A shown without electrical devices 910 and 912 and receptacle connector 1100. As shown, slots 907 are formed in the housing 905 that contain and align the lead assemblies 908 therein. FIG. 17 also shows connection pins 932, 942. Connection pins 942 connect connector 902 to electrical device 912. Connection pins 932 electrically connect connector 902 to electrical device 910 via receptacle 1100. Connection pins 932 and 942 may be adapted to provide through-mount or surface-mount connections to an electrical device (not shown).

In one embodiment, the housing 905 is made of plastic, however, any suitable material may be used. The connections to electrical devices 910 and 912 may be surface or through mount connections.

Figure 18:
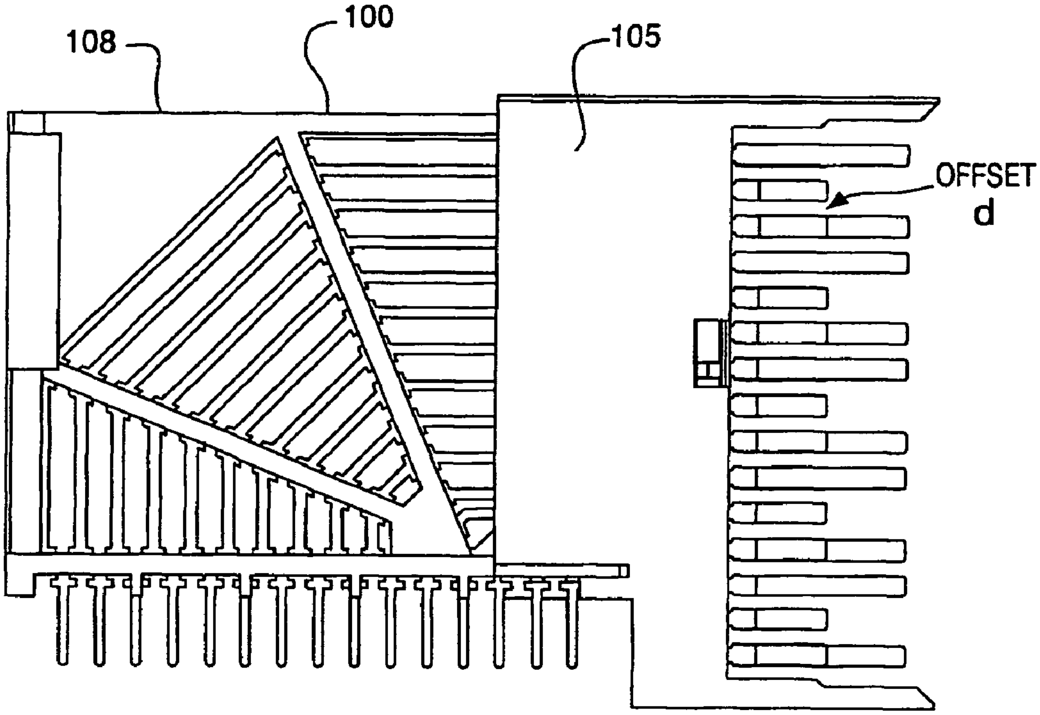
FIG. 18 is a side view of the plug connector of FIG. 17.

FIG. 18 is a side view of plug connector 902 as shown in FIG. 17. As shown, the column of terminals contained in each lead assembly 908 are offset from another column of terminals in an adjacent lead assembly by a distance d. Such an offset is discussed more fully above in connection with FIGS. 6 and 7.

Figure 19A:
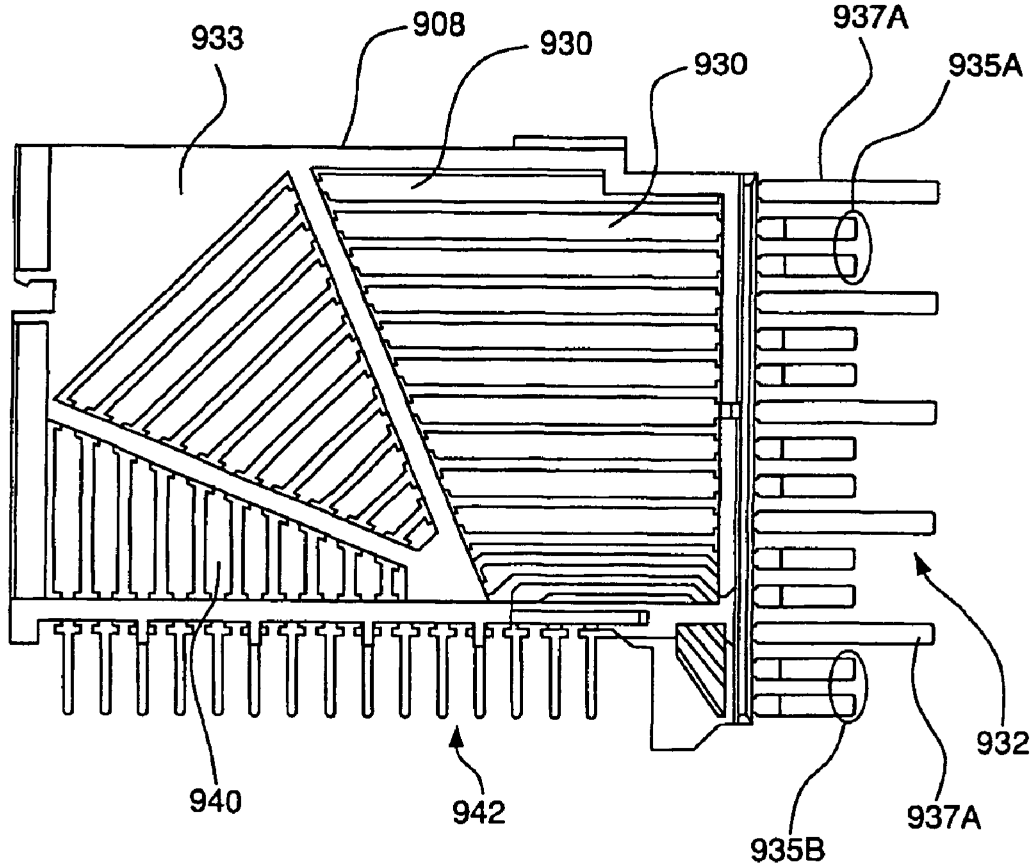
FIG. 19A is a side view of a lead assembly of the plug connector of FIG. 17.

FIG. 19A is a side view of a single lead assembly 908. As shown in FIG. 19A, one embodiment of lead assembly 908 comprises a metal lead frame 940 and an insert molded plastic frame 933. In this manner, the insert molded lead assembly 933 serves to contain one column of terminals or conductors 930. The terminals may comprise either differential pairs or ground contacts. In this manner, each lead assembly 908 comprises a column of differential pairs 935A and 935B and ground contacts 937.

As is also shown in FIG. 19A, the column of differential pairs and ground contacts contained in each lead assembly 908 are arranged in a signal-signal-ground configuration. In this manner, the top contact of the column of terminals in lead assembly 908 is a ground contact 937A. Adjacent to ground contact 937A is a differential pair 935A comprised of a two signal contacts, one with a positive polarity and one with a negative polarity.

Figure 19B:
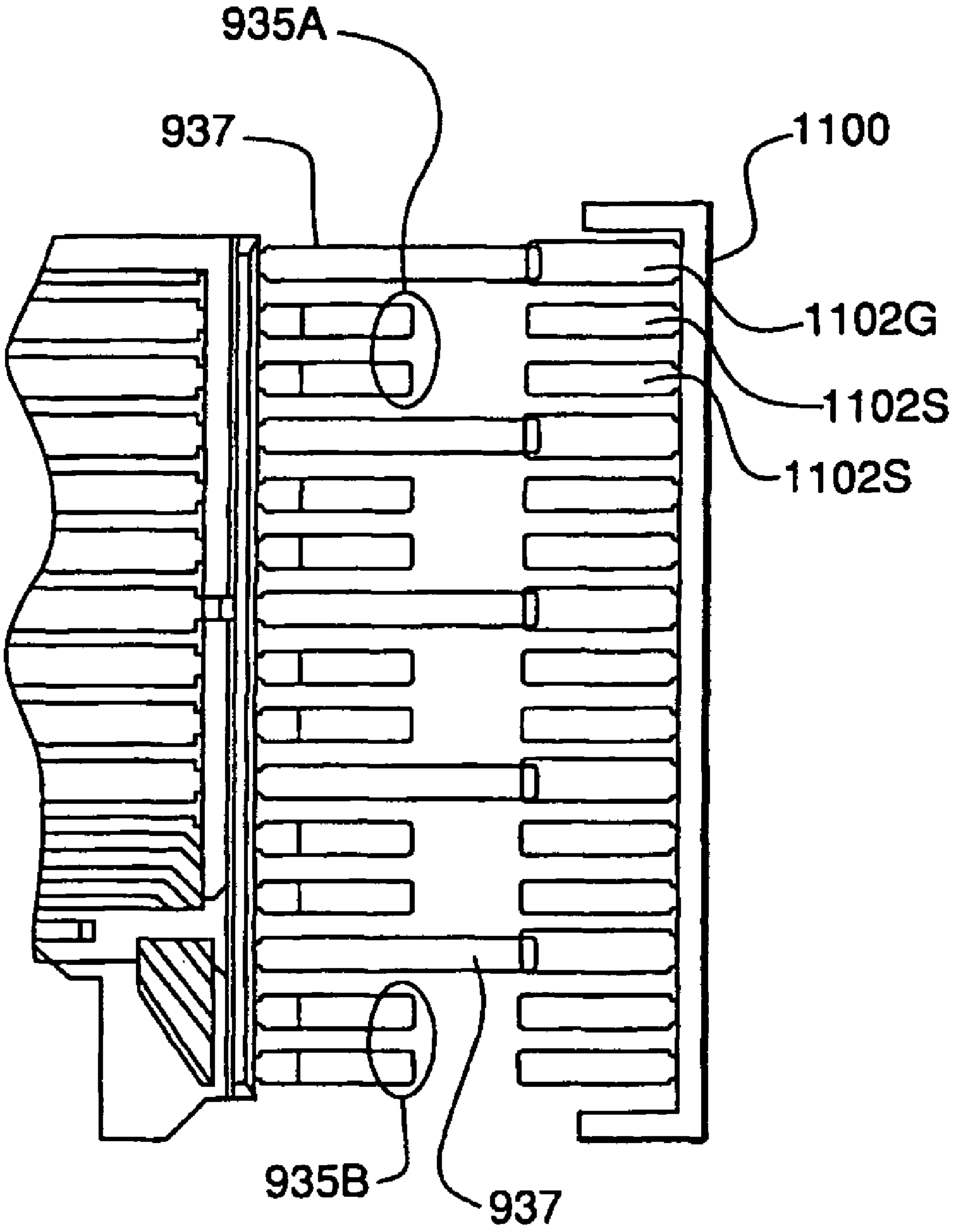
FIG. 19B depicts the lead assembly of FIG. 19 during mating.

As shown, the ground contacts 937A and 937B extend a greater distance from the insert molded lead assembly 933. As shown in FIG. 19B, such a configuration allows the ground contacts 937 to mate with corresponding receptacle contacts 1102G in receptacle 1100 before the signal contacts 935 mate with corresponding receptacle contacts 1102S. Thus, the connected devices (not shown in FIG. 19B) can be brought to a common ground before signal transmission occurs between them. This provides for "hot" connection of the devices.

Lead assembly 908 of connector 900 is shown as a right angle module. To explain, a set of first connection pins 932 is positioned on a first plane (e.g., coplanar with first electrical device 910) and a set of second connection pins 942 is positioned on a second plane (e.g., coplanar with second electrical device 912) perpendicular to the first plane. To connect the first plane to the second plane, each conductor 930 is formed to extend a total of about ninety degrees (a right angle) to electrically connect electrical devices 910 and 912.

Figure 20:
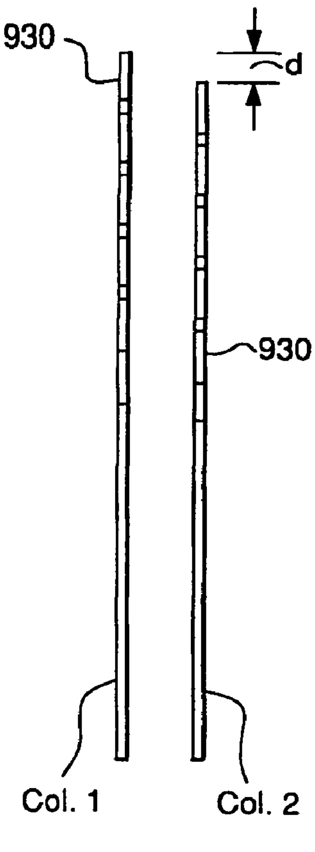
FIG. 20 is a side view of two columns of terminals in accordance with one embodiment of the invention.
Figure 21:
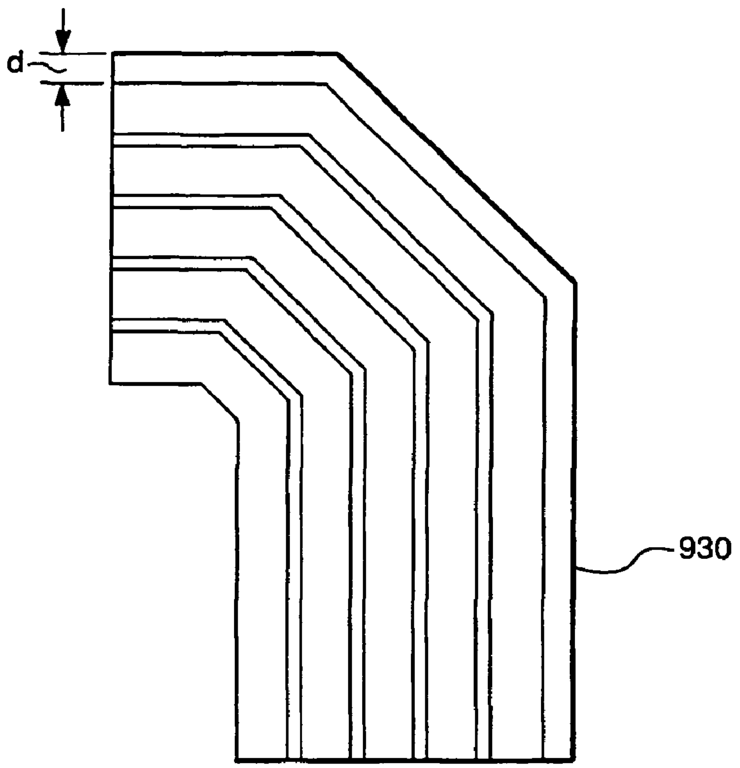
FIG. 21 is a front view of the terminals of FIG. 20.

FIGS. 20 and 21 are side and front views, respectively, of two columns of terminals in accordance with one aspect of the invention. As shown in FIGS. 20 and 21, adjacent columns of terminals are staggered in relation to one another. In other words, an offset exists between terminals in adjacent lead assemblies. In particular and as shown in FIGS. 20 and 21, an offset of distance d exists between terminals in column 1 and terminals in column 2. As shown, the offset d runs along the entire length of the terminal. As stated above, the offset reduces the incidence of cross talk by furthering the distance between the signal carrying contacts.

To simplify conductor placement, conductors 930 have a rectangular cross section as shown in FIG. 20. Conductors 930 may, however, be any shape.

Figure 22:
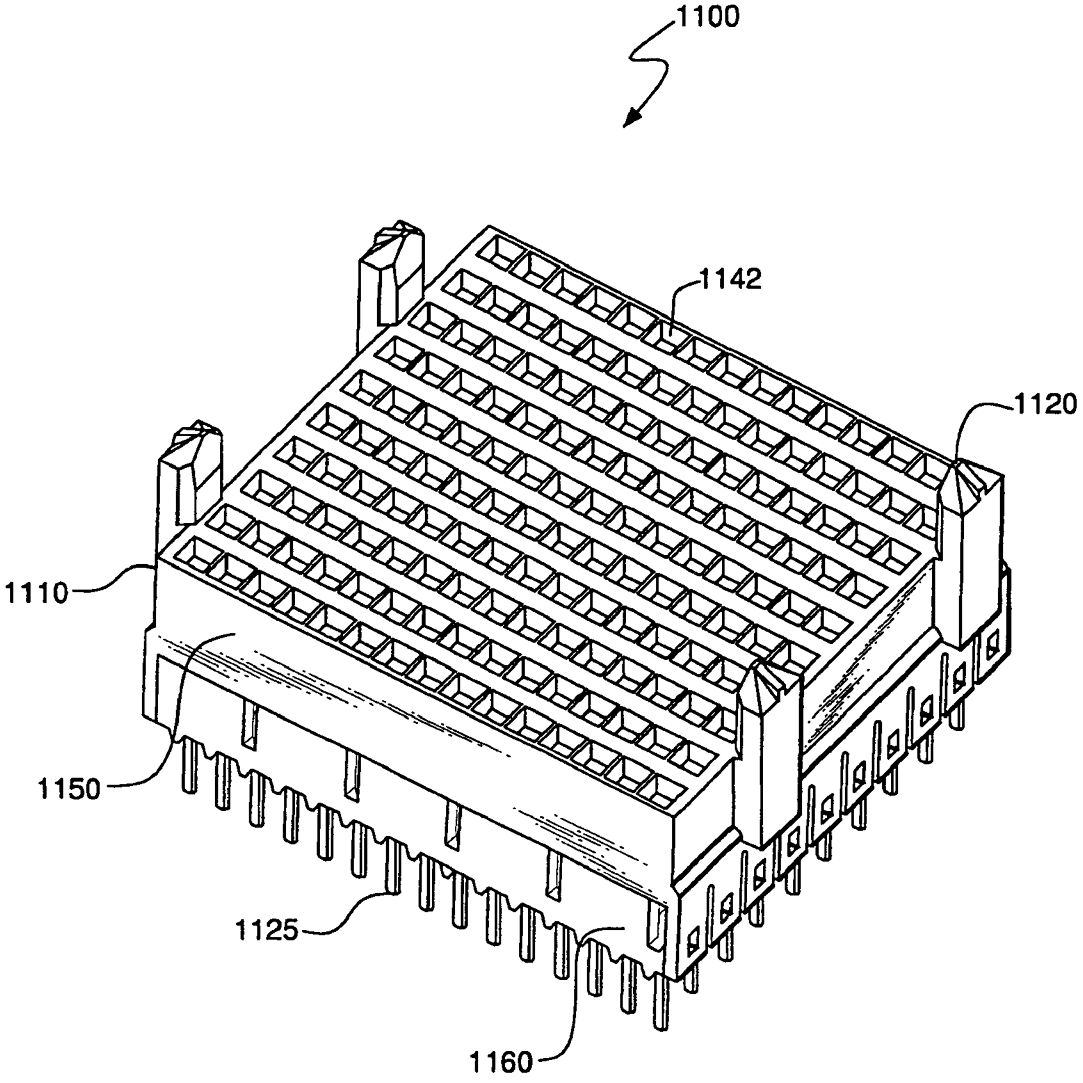
FIG. 22 is a perspective view of a receptacle in accordance with another embodiment of the invention.

FIG. 22 is a perspective view of the receptacle portion of the connector shown in FIG. 16A. Receptacle 1100 may be mated with connector plug 902 (as shown in FIG. 16A) and used to connect two electrical devices (not shown). Specifically, connection pins 932 (as shown in FIG. 17) may be inserted into aperatures 1142 to electrically connect connector 902 to receptacle 1100. Receptacle 1100 also includes alignment structures 1120 to aid in the alignment and insertion of connector 900 into receptacle 1100. Once inserted, structures 1120 also serve to secure the connector once inserted into receptacle 1100. Such structures 1120 thereby prevent any movement that may occur between the connector and receptacle that could result in mechanical breakage therebetween.

Receptacle 1100 includes a plurality of receptacle contact assemblies 1160 each containing a plurality of terminals (only the tails of which are shown). The terminals provide the electrical pathway between the connector 900 and any mated electrical device (not shown).

Figure 23:
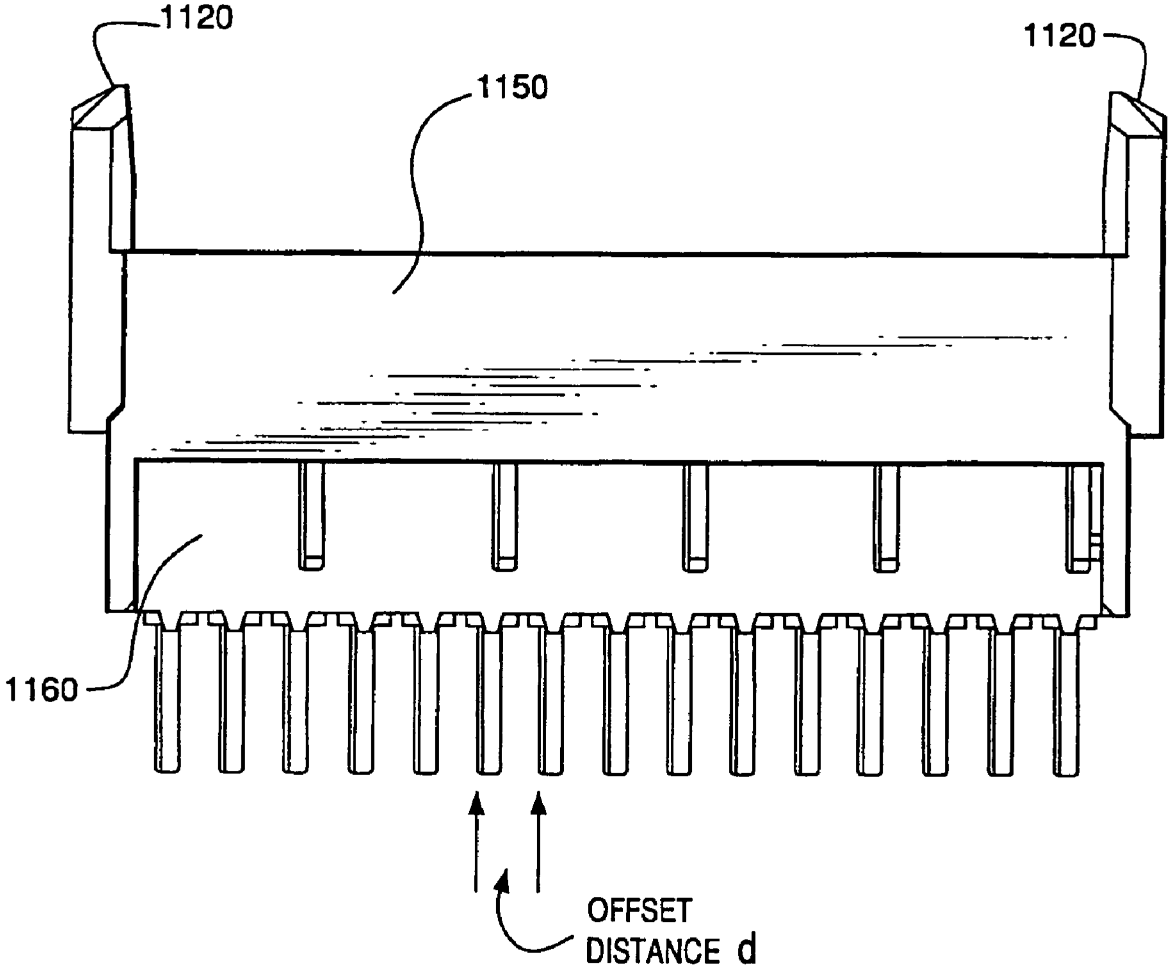
FIG. 23 is a side view of the receptacle of FIG. 22.

FIG. 23 is a side view of the receptacle of FIG. 22 including structures 1120, housing 1150 and receptacle lead assembly 1160. As shown, FIG. 23 also shows that the receptacle lead assemblies may be offset from one another in accordance with the invention. As stated above, such offset reduces the occurrence of multi-active cross talk as described above.

Figure 24:
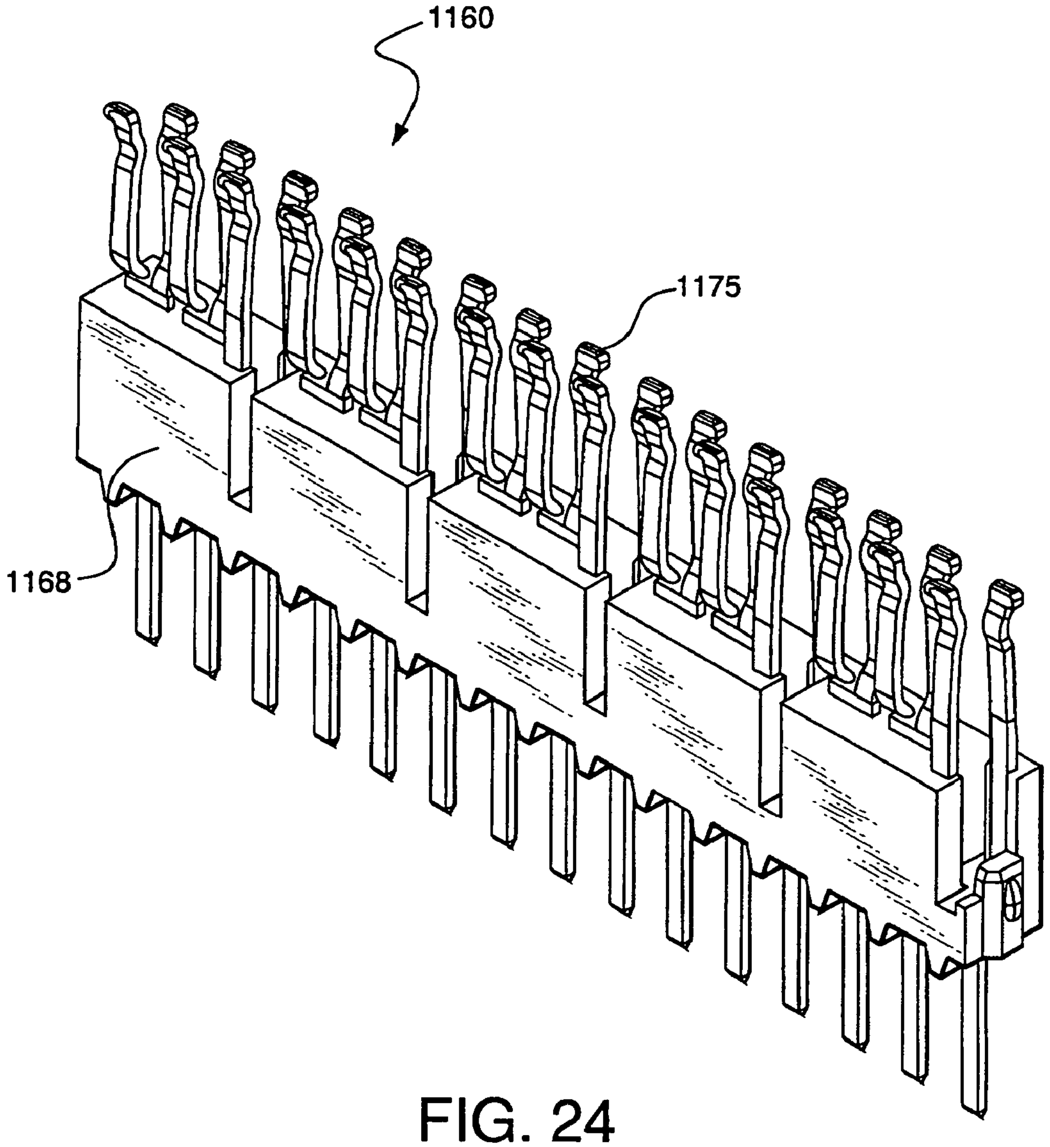
FIG. 24 is a perspective view of a single column of receptacle contacts.

FIG. 24 is a perspective view of a single receptacle contact assembly not contained in receptacle housing 1150. As shown, the assembly 1160 includes a plurality of dual beam conductive terminals 1175 and a holder 1168 made of insulating material. In one embodiment, the holder 1168 is made of plastic injection molded around the contacts; however, any suitable insulating material may be used without departing from the scope of the invention.

Figure 25:
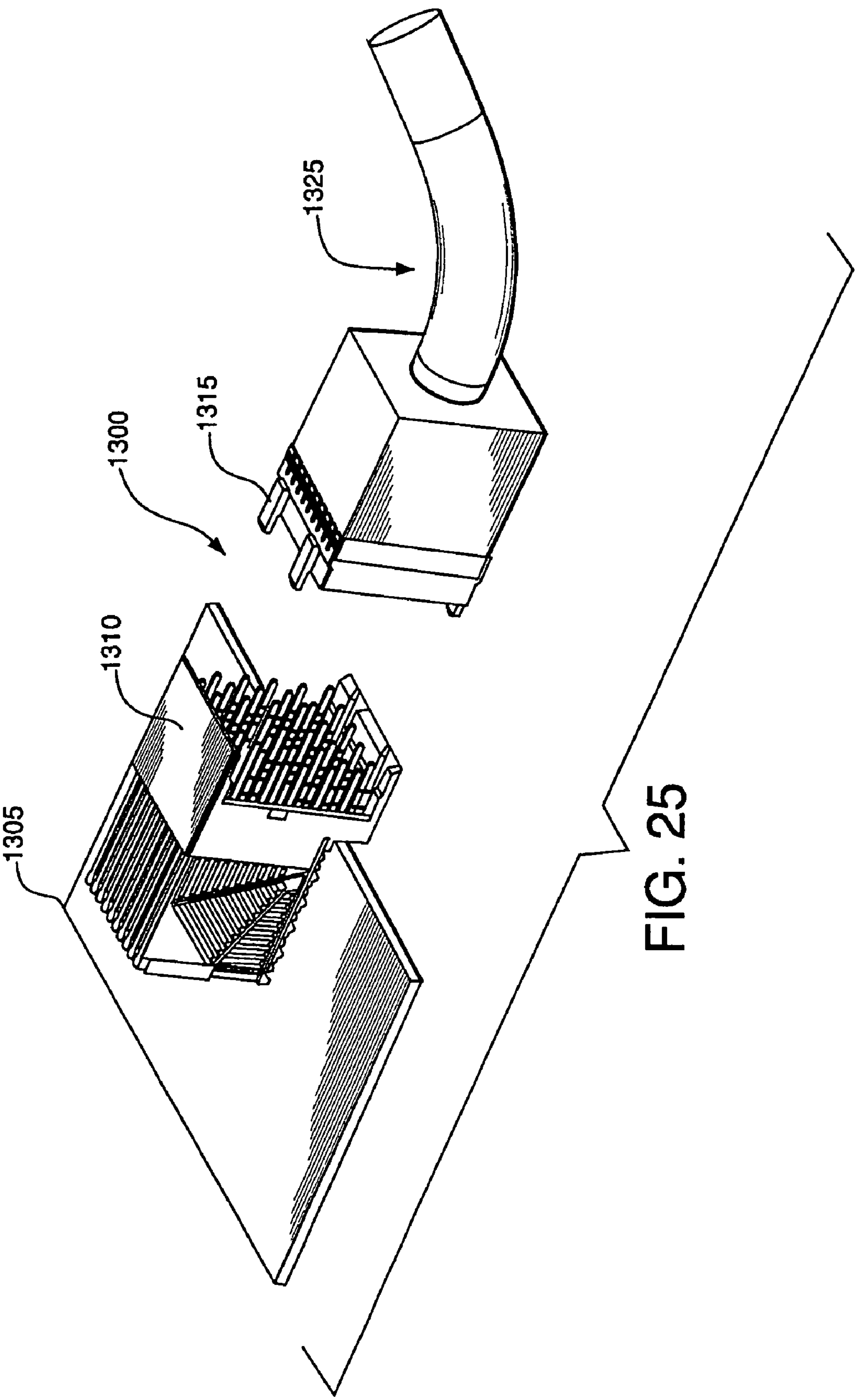
FIG. 25 is a perspective view of a connector in accordance with another embodiment of the invention.

FIG. 25 is a perspective view of a connector in accordance with another embodiment of the invention. As shown, connector 1310 and receptacle 1315 are used in combination to connect an electrical device, such as circuit board 1305 to a cable 1325. Specifically, when connector 1310 is mated with receptacle 1315, an electrical connection is established between board 1305 and cable 1325. Cable 1325 can then transmit signals to any electrical device (not shown) suitable for receiving such signals.

Figure 26:
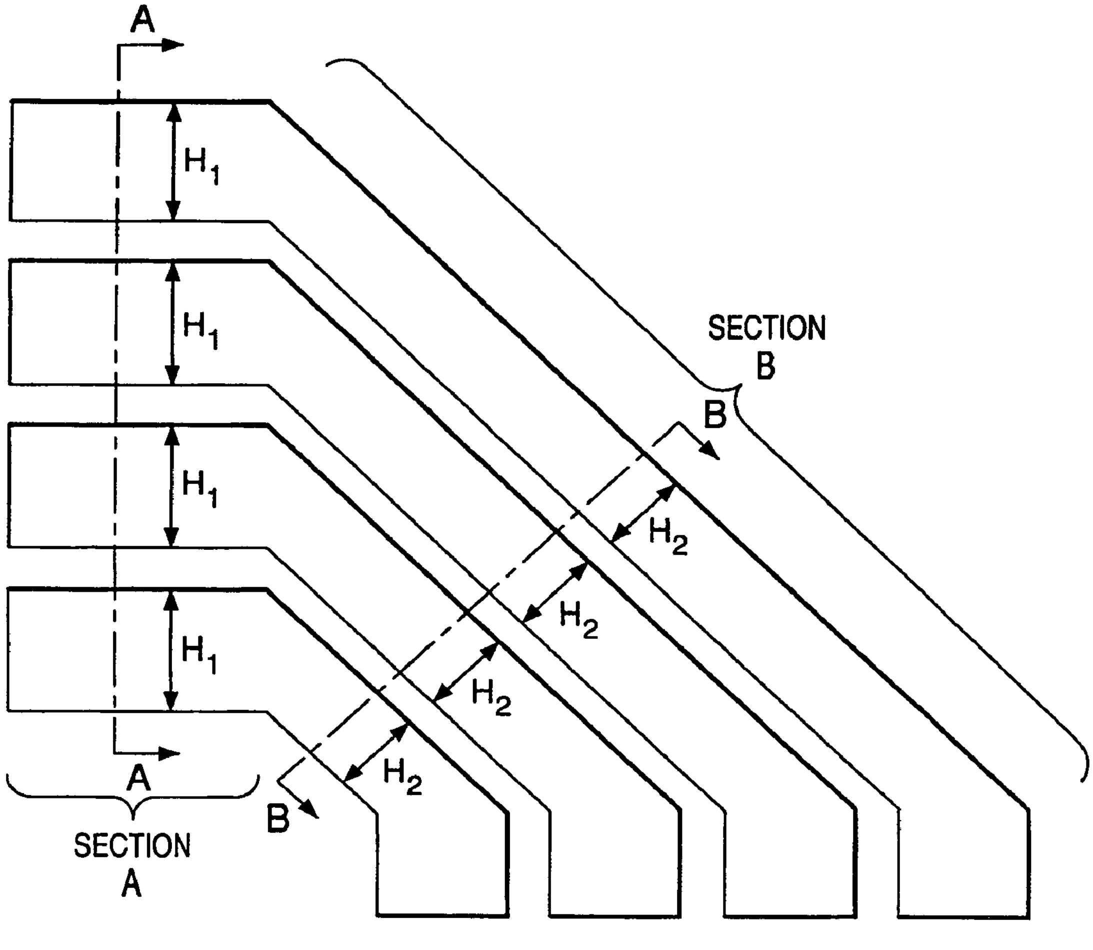
FIG. 26 is a side view of a column of right angle terminals in accordance with another aspect of the invention.

In another embodiment of the invention, it is contemplated that the offset distance, d, may vary throughout the length of the terminals in the connector. In this manner, the offset distance may vary along the length of the terminal as well as at either end of the conductor. To illustrate this embodiment and referring now to FIG. 26, a side view of a single column of right angle terminals is shown. As shown, the height of the terminals in section A is height H1 and the height of the cross section of terminals in section B is height H2.

Figure 27:
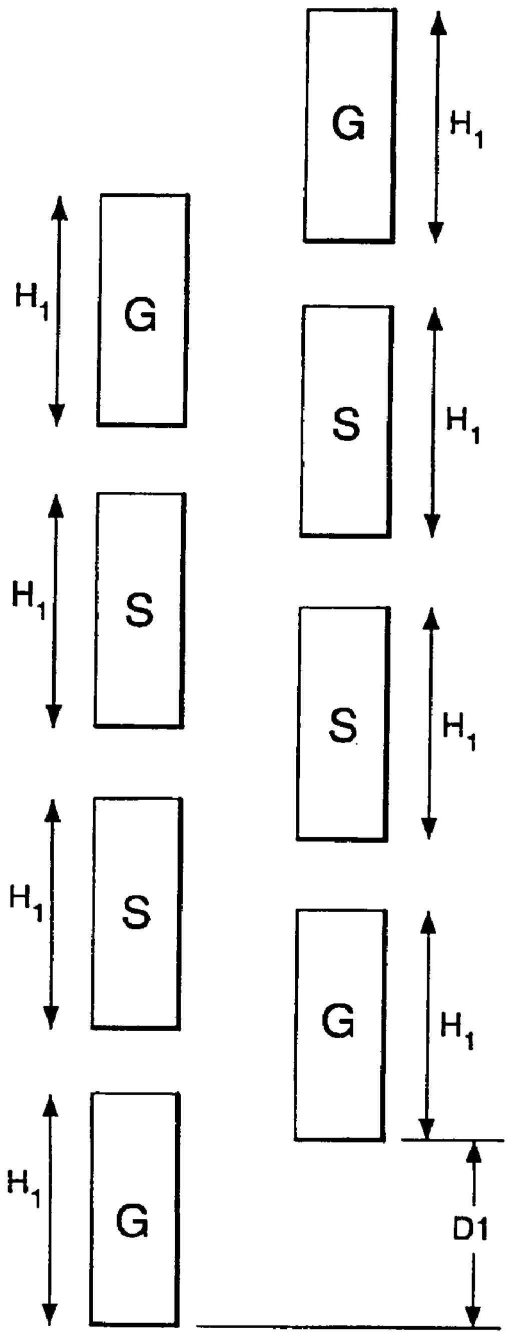
FIGS. 27 and 28 are front views of the right angle terminals of FIG. 26 taken along lines A—A and lines B—B respectively.
Figure 28:
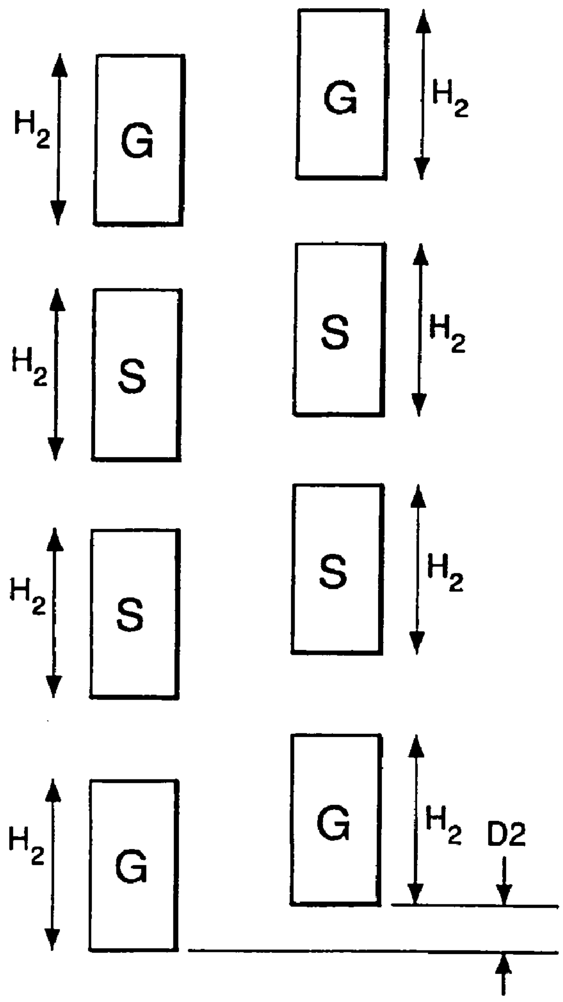

FIGS. 27 and 28 are front views of the columns of right angle terminals taken along lines A—A and lines B—B respectively. In addition to the single column of terminals shown in FIG. 26, FIGS. 27 and 28 also show an adjacent column of terminals contained in the adjacent lead assembly contained in the connector housing.

In accordance with the invention, the offset of adjacent columns may vary along the length of the terminals within the lead assembly. More specifically, the offset between adjacent columns varies according to adjacent sections of the terminals. In this manner, the offset distance between columns is different in section A of the terminals than in section B of the terminals.

As shown in FIGS. 27 and 28, the cross sectional height of terminals taken along line A—A in section A of the terminal is $H_1$ and the cross sectional height of terminals in section B taken along line B—B is height $H_2$. As shown in FIG. 27, the offset of terminals in section A, where the cross sectional height of the terminal is $H_1$, is a distance $D_1$.

Similarly, FIG. 28 shows the offset of the terminals in section B of the terminal. As shown, the offset distance between terminals in section B of the terminal is $D_2$. Preferably, the offset $D_2$ is chosen to minimize crosstalk, and may be different from the offset $D_2$ because spacing or other parameters are different. The multi-active cross talk that occurs between the terminals can thus be reduced, thereby increasing signal integrity.

In another embodiment of the invention, to further reduce cross talk, the offset between adjacent terminal columns is different than the offset between vias on a mated printed circuit board. A via is conducting pathway between two or more layers on a printed circuit board. Typically, a via is created by drilling through the printed circuit board at the appropriate place where two or more conductors will interconnect.

Figure 29:
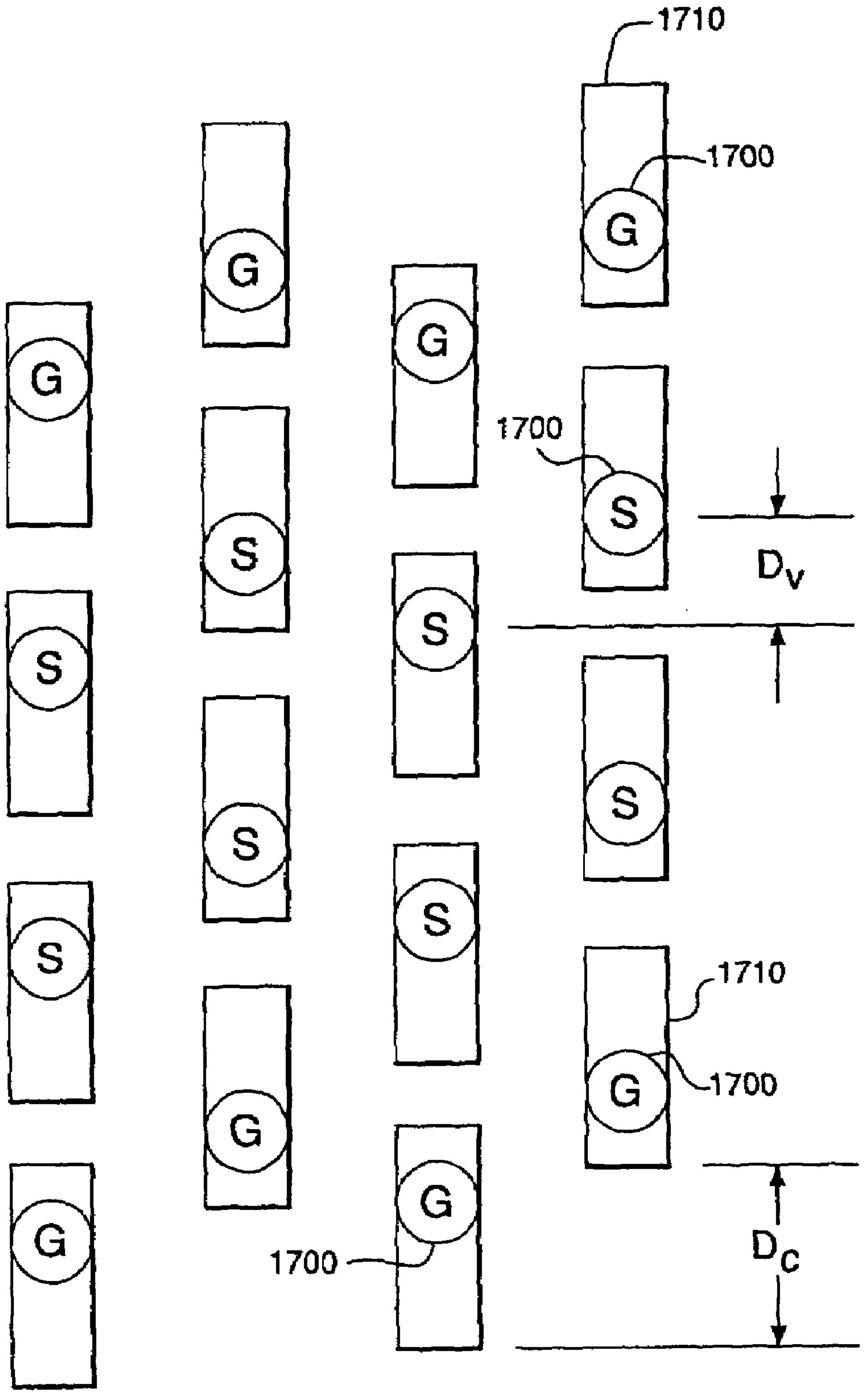
FIG. 29 illustrates the cross section of terminals as the terminals connect to vias on an electrical device in accordance with another aspect of the invention.

To illustrate such an embodiment, FIG. 29 illustrates a front view of a cross section of four columns of terminals as the terminals mate to vias on an electrical device. Such an electric device may be similar to those as illustrated in FIG. 16A. The terminals 1710 of the connector (not shown) are inserted into vias 1700 by connection pins (not shown). The connection pins, however, may be similar to those shown in FIG. 17.

In accordance with this embodiment of the invention, the offset between adjacent terminal columns is different than the offset between vias on a mated printed circuit board. Specifically, as shown in FIG. 29, the distance between the offset of adjacent column terminals is $D_c$ and the distance between the offset of vias in an electrical device is $D_v$. By varying these two offset distances to their optimal values in accordance with the invention, the cross talk that occurs in the connector of the invention is reduced and the corresponding signal integrity is maintained.

Figure 30:
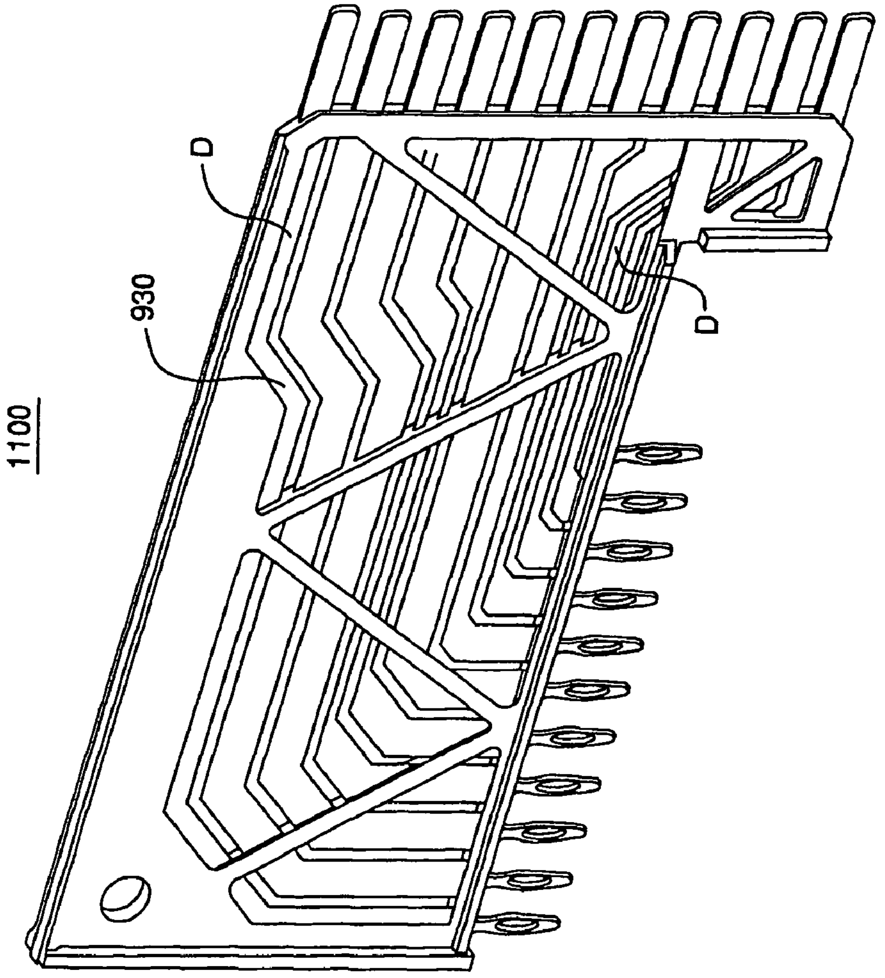
FIG. 30 is a perspective view of a portion of another illustrative right angle electrical connector, in accordance with the invention.

FIG. 30 is a perspective view of a portion of another embodiment of a right angle electrical connector 1100. As shown in FIG. 30, conductors 130 are positioned from a first plane to a second plane that is orthogonal to the first plane. Distance D between adjacent conductors 930 remains substantially constant, even though the width of conductor 930 may vary and even though the path of conductor 930 may be circuitous. This substantially constant gap D provides a substantially constant differential impedance along the length of the conductors.

Figure 31:
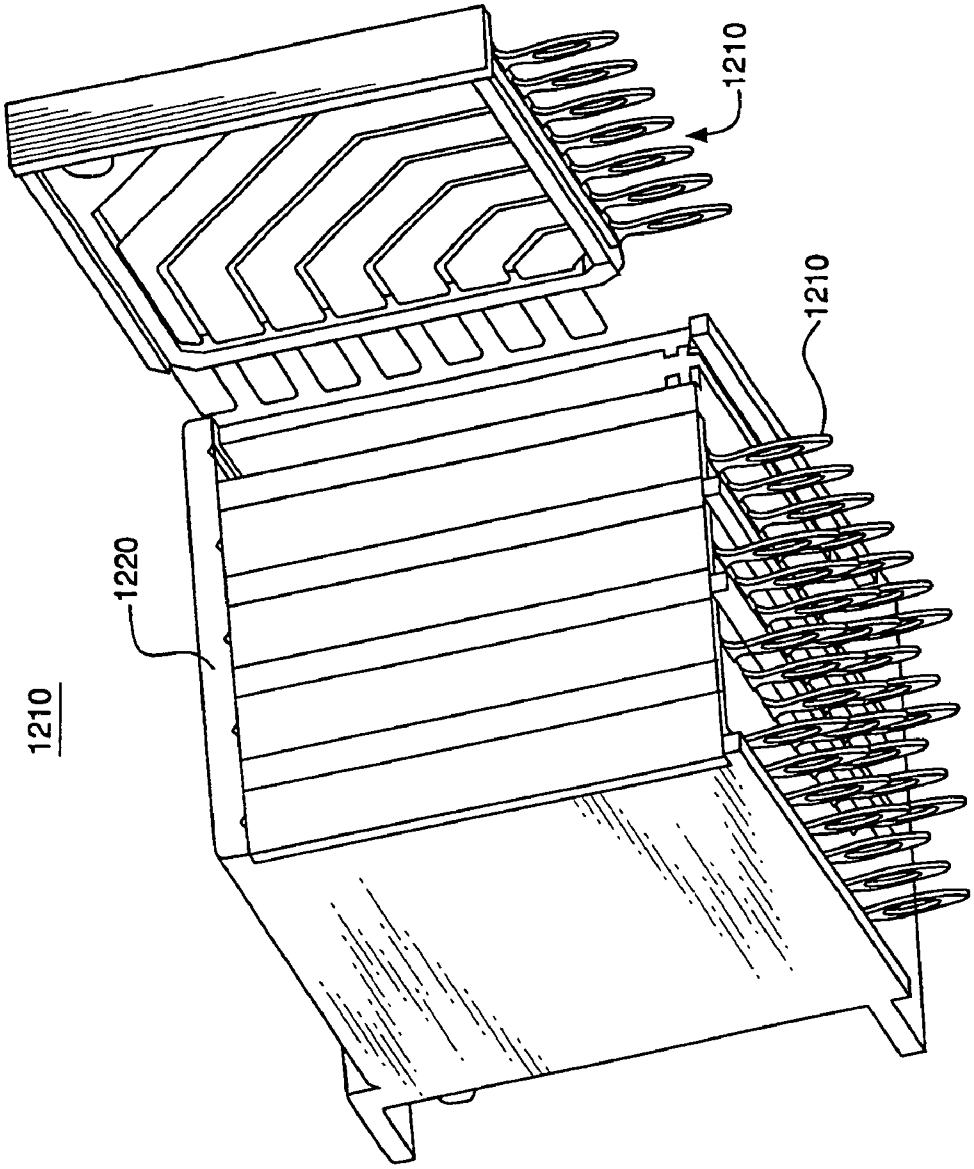
FIG. 31 is a perspective view of another illustrative right angle electrical connector, in accordance with the invention.

FIG. 31 is a perspective view of another embodiment of a right angle electrical connector 1200. As shown in FIG. 12, modules 1210 are positioned in a frame 1220 to provide proper spacing between adjacent modules 1210.

Figure 32:
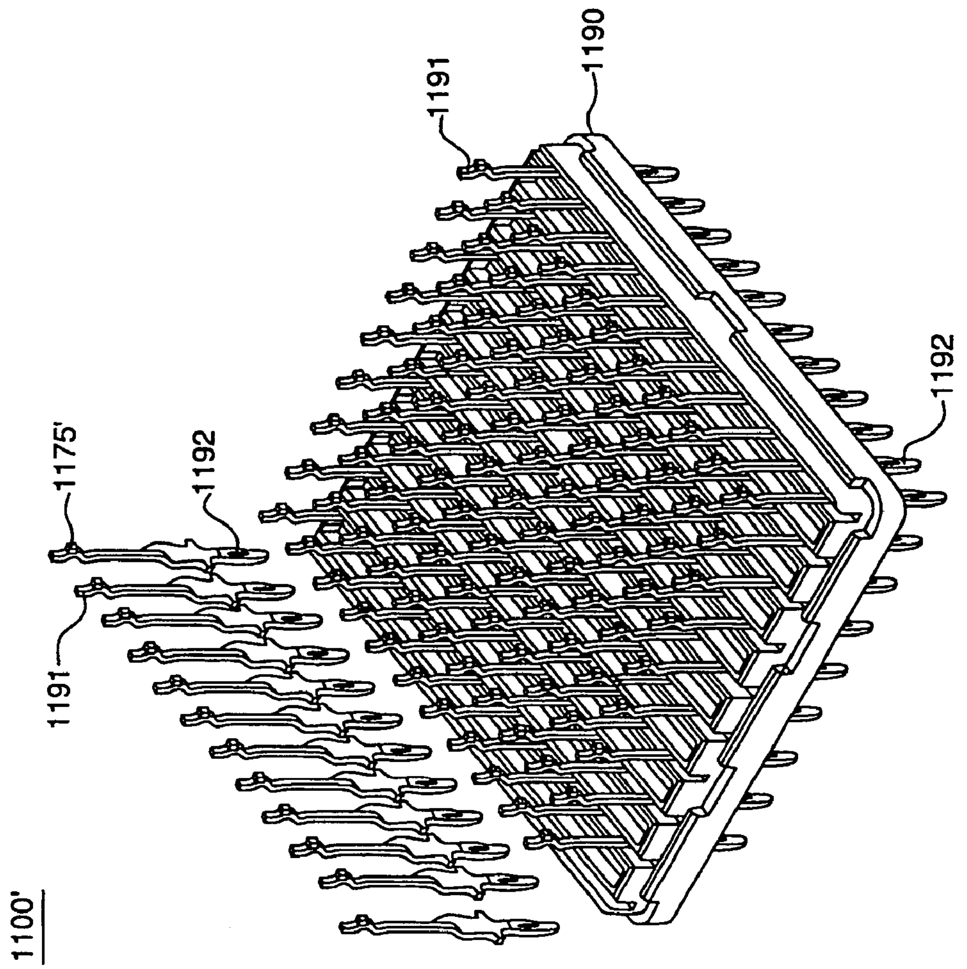
FIG. 32 is a perspective view of an alternative embodiment of a receptacle connector.

FIG. 32 is a perspective view of an alternate embodiment of a receptacle connector 1100'. As shown in FIG. 32, connector 1100' comprises a frame 1190 to provide proper spacing between connection pins 1175'. Frame 1190 comprises recesses, in which conductors 1175' are secured. Each conductor 1175' comprises a single contact interface 1191 and a connection pin 1192. Each contact interface 1191 extends from frame 1190 for connection to a corresponding plug contact, as described above. Each connection pin 1942 extends from frame 1190 for electrical connection to a second electrical device. Receptacle connector 1190 may be assembled via a stitching process.

Figure 33:
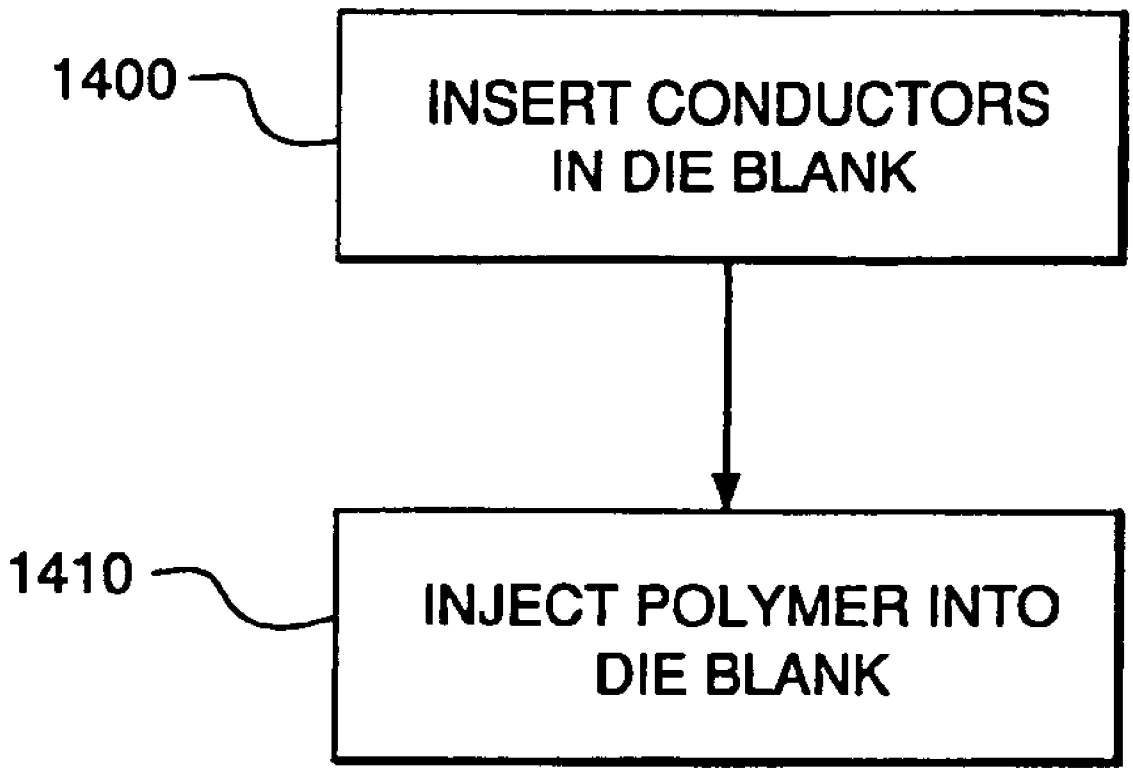
FIG. 33 is a flow diagram of a method for making a connector in accordance with the invention.

To attain desirable gap tolerances over the length of conductors 903, connector 900 may be manufactured by the method as illustrated in FIG. 33. As shown in FIG. 33, at step 1400, conductors 930 are placed in a die blank with predetermined gaps between conductors 930. At step 1410, polymer is injected into the die blank to form the frame of connector 900. The relative position of conductors 930 are maintained by frame 950. Subsequent warping and twisting caused by residual stresses can have an effect on the variability, but if well designed, the resultant frame 950 should have sufficient stability to maintain the desired gap tolerances. In this manner, gaps between conductors 930 can be controlled with variability of tenths of thousandths of an inch.

Preferably, to provide the best performance, the current carrying path through the connector should be made as highly conductive as possible. Because the current carrying path is known to be on the outer portion of the contact, it is desirable that the contacts be plated with a thin outer layer of a high conductivity material. Examples of such high conductivity materials include gold, copper, silver, a tin alloy.

It is to be understood that the foregoing illustrative embodiments have been provided merely for the purpose of explanation and are in no way to be construed as limiting of the invention. Words which have been used herein are words of description and illustration, rather than words of limitation. Further, although the invention has been described herein with reference to particular structure, materials and/or embodiments, the invention is not intended to be limited to the particulars disclosed herein. Rather, the invention extends to all functionally equivalent structures, methods and uses, such as are within the scope of the appended claims. Those skilled in the art, having the benefit of the teachings of this specification, may affect numerous modifications thereto and changes may be made without departing from the scope and spirit of the invention in its aspects.

What is claimed is:

1. An electrical connector, comprising:

a first column of electrical contacts comprising a first arrangement of differential signal pairs separated from one another by first ground contacts;

a second column of electrical contacts comprising a second arrangement of differential signal pairs separated from one another by second ground contacts, wherein one differential signal pair in the second arrangement of differential signal pairs is a victim differential signal pair; and a third column of electrical contacts comprising a third arrangement of differential signal pairs separated from one another by third ground contacts, wherein (i) the second column is adjacent to the first column, and the third column is adjacent to the second column; (ii) the connector is devoid of electrical shields between the first column and the second column, and between the second column and the third column; (iii) the contacts in the first column are spaced apart from the contacts in the second column by a column-spacing distance of about 1.8–2.0 millimeters and the contacts in the second column are spaced apart from the contacts in the third column by the column-spacing distance; (iv) each of the differential signal pairs defines a gap distance between the electrical contacts that form the pair; and (v) the gap distance relative to the column-spacing distance is such that differential signals with rise times of 200 picoseconds in the six differential signal pairs in the first, second, and third columns that are closest to the victim pair produce no more than 6% worst-case, multi-active cross talk on the victim differential signal pair.

2. The electrical connector as claimed in claim 1, wherein each differential signal pair comprises two electrical signal contacts that are tightly electrically coupled to one another.

3. The electrical connector as claimed in claim 1, wherein a differential signal pair in the third column is offset from the victim differential signal pair by a row pitch.

4. The electrical connector as claimed in claim 1, wherein a differential signal pair in the third column is offset from the victim differential signal pair by an offset distance that is less than a row pitch.

5. The electrical connector as claimed in claim 1, wherein a differential signal pair in the third column is offset from the victim differential signal pair by more than a row pitch.

6. The electrical connector as claimed in claim 1, wherein the impedance of the first differential signal pair is between about 90 and 110 Ohms.

7. The electrical connector as claimed in claim 1, wherein the 200 picosecond rise time represents a data transfer rate greater than 1.25 Gigabits/sec and less than 2.5 Gigabits/sec.

8. The electrical connector as claimed in claim 1, wherein electrical contacts that form a differential signal pair in the first column extend from a mating face of the connector and one of the first ground contacts extend farther from the mating face than the electrical contacts.

9. The electrical connector as claimed in claim 1, wherein electrical contacts that form a differential pair in the first column each terminate at a respective end thereof with a corresponding fusible mounting element.

10. The electrical connector as claimed in claim 1, wherein the worst-case, multi-active cross talk on the victim differential signal pair is 4% or less.

11. The electrical connector as claimed in claim 1, wherein the worst-case, multi-active cross talk on the victim differential signal pair is 3% or less.

12. The electrical connector as claimed in claim 1, wherein the electrical connector has an insertion loss of less than about 0.7 dB at 5 GHz.

13. The electrical connector as claimed in claim 1, wherein the differential signal pairs are broadside coupled.

14. The electrical connector as claimed in claim 1, wherein the gap distance relative to the column-spacing distance is such that differential signals with rise times of 150 picoseconds in the six differential signal pairs in the first, second, and third columns that are closest to the victim pair produce no more than 6% worst-case cross talk on the victim differential signal pair.

15. The electrical connector as claimed in claim 14, wherein the 150 picosecond rise time represents a data transfer rate of about 2.5 Gigabits/sec.

16. The electrical connector as claimed in claim 1, wherein the gap distance relative to the column-spacing distance is such that differential signals with rise times of 100 picoseconds in the six differential signal pairs in the first, second, and third columns that are closest to the victim pair produce no more than 6% worst-case cross talk on the victim differential signal pair.

17. The electrical connector as claimed in claim 16, wherein the 100 picosecond rise time represents a data transfer rate of about 3.2 Gigabits/sec.

18. The electrical connector as claimed in claim 1, wherein the gap distance relative to the column-spacing distance is such that differential signals with rise times of 50 picoseconds in the six differential signal pairs in the first, second, and third columns that are closest to the victim pair produce no more than 6% worst-case cross talk on the victim differential signal pair.

19. The electrical connector as claimed in claim 18, wherein the 50 picosecond rise time represents a data transfer rate greater than 4.8 Gigabits/sec and less than 10 Gigabits/sec.

20. The electrical connector as claimed in claim 1, wherein the gap distance relative to the column-spacing distance is such that differential signals with rise times of 40 picoseconds in the six differential signal pairs in the first, second, and third columns that are closest to the victim pair produce no more than 6% worst-case cross talk on the victim differential signal pair.

21. The electrical connector as claimed in claim 20, wherein the 40 picosecond rise time represents a data transfer rate of about 10 Gigabits/sec.

22. An electrical connector comprising:

a first electrical connector half and a second electrical connector half that mates with the first electrical connector half, the first electrical connector half and the second electrical connector half each comprising:

a first column of electrical contacts comprising a first differential signal pair of electrical contacts, a first ground contact adjacent to the first differential signal pair, a second differential signal pair of electrical contacts adjacent to the first ground contact, a second ground contact adjacent to the second differential signal pair, and a third differential signal pair of electrical contacts adjacent to the second ground contact;

a second column of electrical contacts comprising a fourth differential signal pair of electrical contacts, a third ground contact adjacent to the fourth differential signal pair, a fifth differential signal pair of electrical contacts adjacent to the third ground contact, a fourth ground contact adjacent to the fifth differential signal pair, and a sixth differential signal pair of electrical contacts adjacent to the fourth ground contact; and a third column of electrical contacts comprising a seventh differential signal pair of electrical contacts, a fifth ground contact adjacent to the seventh differential signal pair, an eighth differential signal pair of electrical contacts adjacent to the fifth ground contact, a sixth ground contact adjacent to the eighth differential signal pair, and a ninth differential signal pair of electrical contacts adjacent to the sixth ground contact, wherein (i) the second column of electrical contacts is adjacent to the first column of electrical contacts and the third column of electrical contacts; (ii) the connector is devoid of electrical shields between the first, second, and third columns; (iii) the electrical contacts in the first column are spaced apart from the electrical contacts in the second column by a column-spacing distance, and the contacts in the second column are spaced apart from the contacts in the third column by the column-spacing distance; (iv) the electrical contacts that comprise the first differential signal pair are spaced apart by a gap distance that is less than the column-spacing distance; and (v) differential signals with rise times of 40 picoseconds in the six differential signal pairs in the first, second, and third columns that are closest to the fifth differential signal pair produce no more than 600 worst-case, multi-active cross talk on the fifth differential signal pair.

23. The electrical connector as claimed in claim 22, wherein electrical signal contacts in the first differential signal pair are tightly electrically coupled to each other.

24. The electrical connector as claimed in claim 22, wherein the fourth differential signal pair is offset from the first differential signal pair by a row pitch.

25. The electrical connector as claimed in claim 22, wherein the fourth differential signal pair is offset from the first differential signal pair by an offset distance that is less than a row pitch.

26. The electrical connector as claimed in claim 22, wherein the fourth differential signal pair is offset from the first differential signal pair by more than a row pitch.

27. The electrical connector as claimed in claim 22, wherein the impedance of the first differential signal pair is between about 90 and 110 Ohms.

28. The electrical connector as claimed in claim 22, wherein the worst-case, multi-active, cross-talk on the fifth differential signal pair is 3% or less.

29. The electrical connector as claimed in claim 22, wherein the 40 picosecond rise time represents a data transfer rate of about 10 Gigabits/sec.

30. The electrical connector as claimed in claim 22, wherein electrical contacts that form a differential signal pair in the first column of the first connector extend from a mating face of the first electrical connector and one of the first ground contacts extends farther from the mating face than the electrical contacts.

31. The electrical connector as claimed in claim 22, wherein electrical contacts that form the first differential signal pair each terminate at a respective end thereof with a corresponding fusible mounting element.

32. The electrical connector as claimed in claim 22, wherein worst-case, multi-active cross talk on the fifth differential signal pair is 4% or less.

33. The electrical connector as claimed in claim 22, wherein worst-case, multi-active cross talk on the fifth differential signal pair is 3% or less.

34. The electrical connector as claimed in claim 22, wherein the electrical connector has an insertion loss of less than about 0.7 dB at 5 GHz.

35. The electrical connector as claimed in claim 22, wherein the differential signal pairs are broadside coupled.

36. The electrical connector as claimed in claim 22, wherein differential signals with rise times of 150 picoseconds in each of the six closest differential signal pairs produce no more than 6% worst-case, multi-active cross talk on the fifth differential signal pair.

37. The electrical connector as claimed in claim 36, wherein the 150 picosecond rise time represents a data transfer rate of about 2.5 Gigabits/sec.

38. The electrical connector as claimed in claim 22, wherein differential signals with rise times of 100 picoseconds in each of the six closest differential signal pairs produce no more than 60% worst-case, multi-active cross talk on the fifth differential signal pair.

39. The electrical connector as claimed in claim 38, wherein the 100 picosecond rise time represents a data transfer rate of about 3.2 Gigabits/sec.

40. The electrical connector as claimed in claim 22, wherein differential signals with rise times of 50 picoseconds in each of the six closest differential signal pairs produce no more than 6% worst-case, multi-active cross talk on the fifth differential signal pair.

41. The electrical connector as claimed in claim 40, wherein the 50 picosecond rise time represents a data transfer rate greater than 4.8 Gigabits/sec and less than 10 Gigabits/sec.

42. The electrical connector as claimed in claim 22, wherein differential signals with rise times of 200 picoseconds in each of the six closest differential signal pairs produce no more than 6% worst-case, multi-active cross talk on the fifth differential signal pair.

43. The electrical connector as claimed in claim 42, wherein the 200 picosecond rise time represents a data transfer rate greater than 1.25 Gigabits/sec and less than 2.5 Gigabits/sec.

44. An electrical connector comprising:

a first column of electrical contacts comprising a first arrangement of differential signal pairs each separated from one another by first ground contacts;

a second column of electrical contacts comprising a second arrangement of differential signal pairs each separated from one another by second ground contacts, wherein one differential signal pair in the second arrangement of differential signal pairs is a victim pair; and a third column of electrical contacts comprising a third arrangement of differential signal pairs each separated from one another by third ground contacts, wherein (i) the second column is adjacent to the first column, and the third column is adjacent to the second column (ii) the connector is devoid of electrical shields between the first column and the second column, and between the second column and the third column; (iii) the first column, the second column, and the third column are evenly spaced apart from one another by an equal column-spacing distance of about 1.8 to 2 millimeters; (iv) each of the differential signal pairs defines a gap distance between electrical contacts that form each differential signal pair; and (v) the gap distance relative to the column-spacing distance is such that differential signals with rise times of 40 picoseconds in the six differential signal pairs in the first, second, and third columns that are closest to the victim pair produce no more than an acceptable level of worst-case, multi-active cross talk on the victim pair.

45. The electrical connector as claimed in claim 44, wherein electrical contacts that form the first differential signal pair each terminate at a respective end thereof with a corresponding fusible mounting element.

46. The electrical connector as claimed in claim 44, wherein the impedance of the first differential signal pair is between about 90 and 110 Ohms.

47. The electrical connector as claimed in claim 44, wherein the first ground contact is tightly electrically coupled to one electrical contact in the first differential signal pair.

48. The electrical connector as claimed in claim 44, wherein the first linear array is staggered relative to the second linear array.

49. The electrical connector as claimed in claim 44, wherein the differential signal pairs are broadside coupled.

50. The electrical connector as claimed in claim 44, wherein the gap distance is approximately 0.3 to 0.4 millimeters.

51. The electrical connector as claimed in claim 50, wherein the column-spacing distance defines a column pitch between the first linear array and the second linear array, and the gap distance is based on the column pitch.

52. The electrical connector as claimed in claim 51, wherein the gap distance is between approximately one-tenth of the column pitch and one-fifth of the column pitch.

53. The electrical connector as claimed in claim 51, wherein the gap distance is between approximately one-tenth of the column pitch and one-eighth of the column pitch.

54. The electrical connector as claimed in claim 51, wherein the gap distance is approximately one-fifth of the column pitch.

55. The electrical connector as claimed in claim 51, wherein the column pitch is approximately two millimeters and the gap distance is between approximately 0.3 millimeters and 0.4 millimeters.

56. An electrical connector comprising:

a first linear array of electrical contacts comprising a first signal contact that defines a first side and a first edge, wherein the first side is two or more times greater in length than the first edge;

a second signal contact positioned adjacent to the first signal contact, wherein the second signal contact defines a second side and a second edge and the second side is two or more times greater in length that the second edge; and a first ground contact positioned adjacent to the first signal contact; and a second linear array of electrical contacts comprising a third signal contact that defines a third side and a third edge, wherein the third side is two or more times greater in length than the third edge;

a fourth signal contact positioned adjacent to the third signal contact, wherein the fourth signal contact defines a fourth side and a fourth edge and the fourth side is two or more times greater in length that the fourth edge; and a second ground contact positioned along an imaginary line that is perpendicular to the first linear array of electrical contacts, wherein (i) the first signal contact and the second signal contact are positioned edge-to-edge and form a first differential signal pair; (ii) the third signal contact and the fourth signal contact are positioned edge-to-edge and form a second differential signal pair; (iii) the first signal contact is positioned along the imaginary line that is perpendicular to the first linear array of electrical contacts; (iv) the connector is devoid of electrical shields between the first linear array of electrical contacts and the second linear array of electrical contacts; (v) a gap distance between the first and second signal contacts is less than a distance between the first signal contact and the second ground contact, and (vi) electrical contacts that form the first differential signal pair each terminate at a respective end thereof with a corresponding fusible mounting element.

* * * * *

UNITED STATES PATENT AND TRADEMARK OFFICE

CERTIFICATE OF CORRECTION

PATENT NO. : 7,114,964 B2
APPLICATION NO. : 11/052167
DATED : October 3, 2006
INVENTOR(S) : Clifford L. Winings et al.

It is certified that error appears in the above-identified patent and that said Letters Patent is hereby corrected as shown below:

Title Page, item should read
-- (63) Continuation of application No. 10/294,966, filed on Nov. 14, 2002, now Pat No. 6,976,886, which is a continuation-in-part of application No. 10/155,786, filed on May 24, 2002, now Pat. No. 6,652,318, and is a continuation-in-part of application No. 09/990,794, filed on Nov. 14, 2001, now Pat. No. 6,692,272. --

Col. 19, line 9 (Claim 6), delete "first" and substitute therefor --victim--.

Col. 19, line 17 (Claim 8), delete "extend" and substitute therefor --extends--.

Col. 20, line 59 (Claim 22), delete "600" and substitute therefor --6%--.

Col. 21, line 19 (claim 30), after "connector" insert --half--.

Col. 21, line 20 (claim 30), after "connector" insert --half--.

Col. 22, line 36 (claim 45), delete "first" and substitute therefor --victim --.

Col. 22, line 40 (claim 46), delete "first" and substitute therefor --victim --.

Col. 22, line 43 (claim 47), delete "the first ground contact" and substitute therefor --one of the first ground contacts--; at line 44, delete "first" and substitute therefor --victim--.

Col. 22, line 47 (claim 48), delete "linear array" and substitute therefor --column--; at line 48, delete "linear array" and substitute therefor --column--.

Col. 22, line 56 (claim 51), delete "first linear array" and substitute therefor --first column--; delete "second linear array" and substitute therefor --second column--.

UNITED STATES PATENT AND TRADEMARK OFFICE

CERTIFICATE OF CORRECTION

PATENT NO. : 7,114,964 B2 
APPLICATION NO. : 11/052167
DATED : October 3, 2006
INVENTOR(S) : Clifford L. Winings et al.

It is certified that error appears in the above-identified patent and that said Letters Patent is hereby corrected as shown below:

At col. 21, line 49 (claim 38), delete "60%" and substitute therefor --6%--

Signed and Sealed this

Nineteenth Day of December, 2006

JON W. DUDAS
*Director of the United States Patent and Trademark Office*